United States Patent [19]

Lowenhar

[11] 3,975,581

[45] Aug. 17, 1976

[54] TRANSMISSION LINES USING TUBULAR EXTENDIBLE STRUCTURES

[76] Inventor: Herman Lowenhar, 422 Hudson St., New York, N.Y. 10014

[22] Filed: Sept. 24, 1973

[21] Appl. No.: 400,201

[52] U.S. Cl. .................... 333/33; 174/27; 174/28; 174/29; 174/69; 174/88 C; 333/35; 333/83 R; 333/84 R; 333/84 M; 333/97 R; 343/877

[51] Int. Cl.$^2$ .................... H03H 7/38

[58] Field of Search .............. 174/69, 28, 29, 88 C, 174/75 C, 27; 343/877, 900, 884; 52/108, 2; 333/95 R, 95 A, 96, 84 R, 84 M, 33, 35

[56] References Cited

UNITED STATES PATENTS

| | | | |
|---|---|---|---|
| 3,042,742 | 7/1962 | Foster | 174/69 |
| 3,524,190 | 8/1970 | Killion et al. | 343/877 X |
| 3,541,568 | 11/1970 | Lowenhar | 343/877 |
| 3,569,875 | 3/1971 | Rainwater | 333/96 |
| 3,699,585 | 10/1972 | Morrison | 343/895 X |

*Primary Examiner*—Darrell L. Clay
*Attorney, Agent, or Firm*—Darby & Darby

[57] ABSTRACT

Transmission lines using tubular extendible elements in which two such elements are combined to form a coaxial type transmission line or a two-wire transmission line and in which a single element is constructed as a two-wire transmission line and tubular extendible elements and other structures using materials having various temperature coefficients.

42 Claims, 56 Drawing Figures

FIG. 8
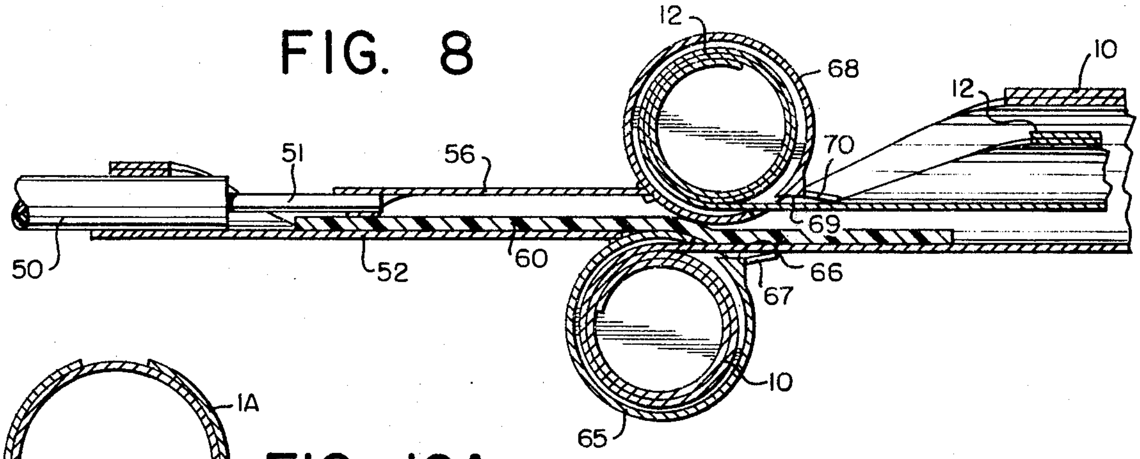
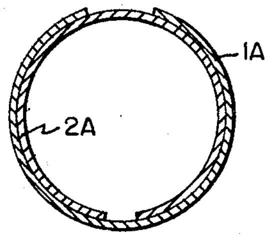
FIG. 10A
FIG. 9
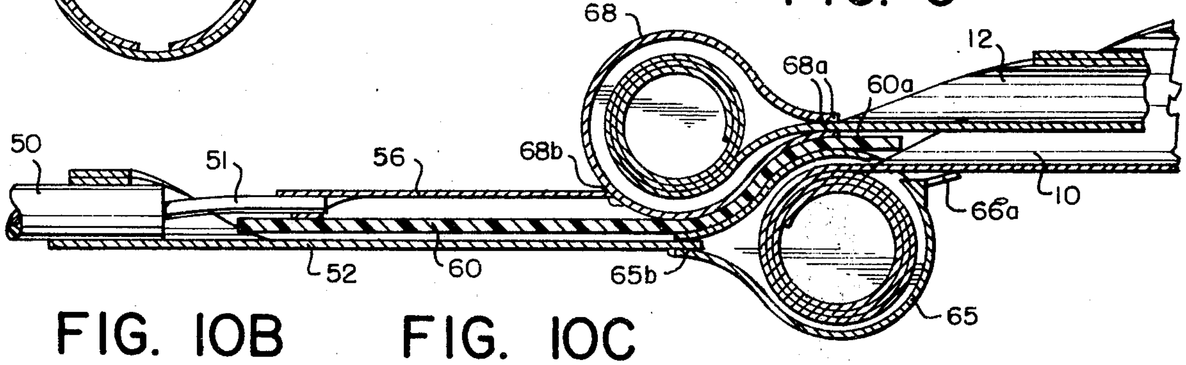
FIG. 10B
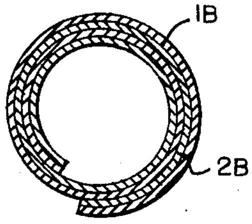
FIG. 10C
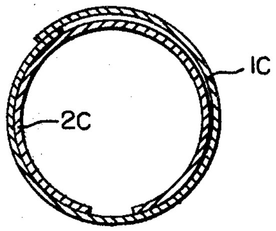
FIG. 12
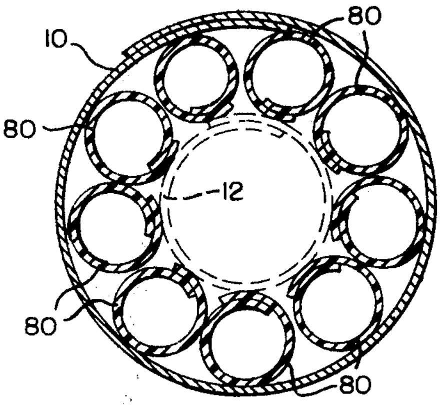
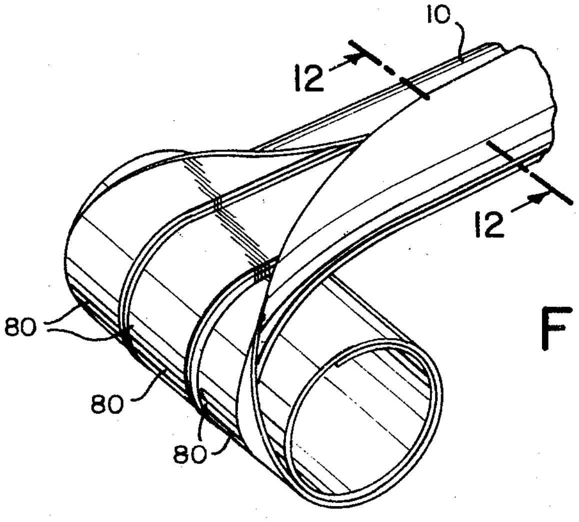
FIG. 11

FIG. 13
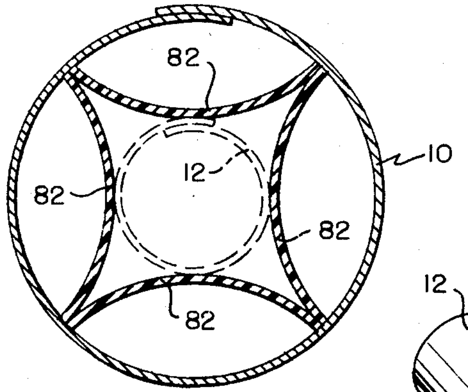
FIG. 13A
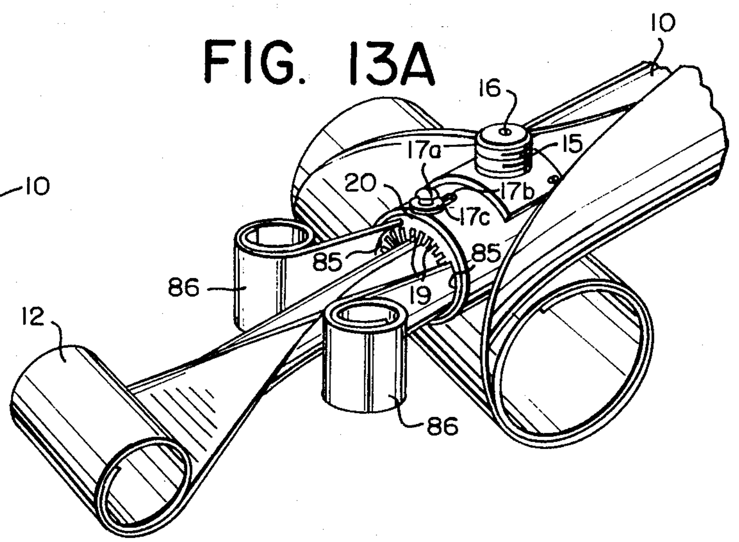
FIG. 17
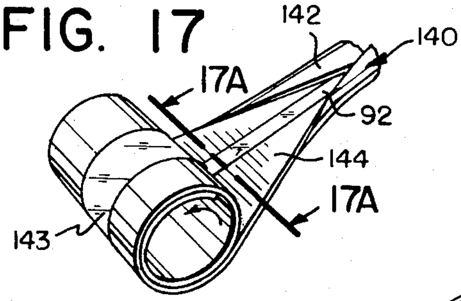
FIG. 14
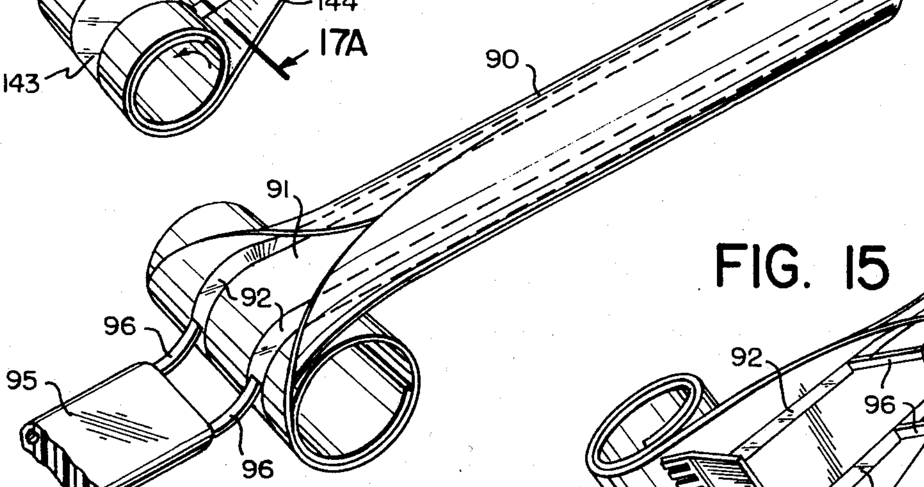
FIG. 15
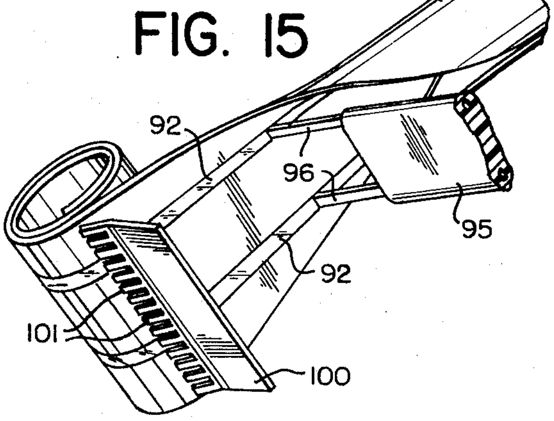
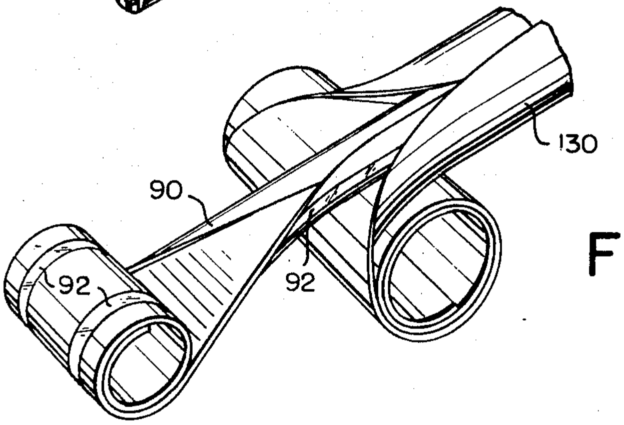
FIG. 16

FIG. 17D
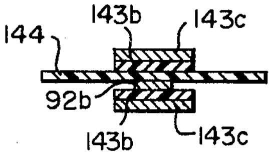
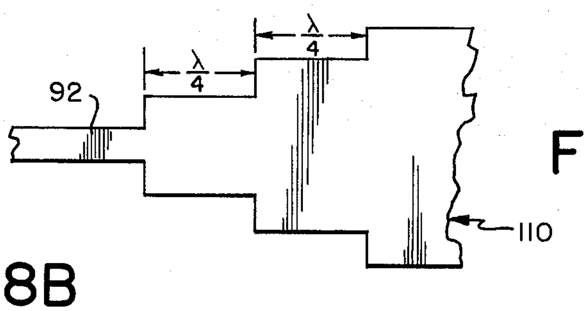
FIG. 18A
FIG. 18B
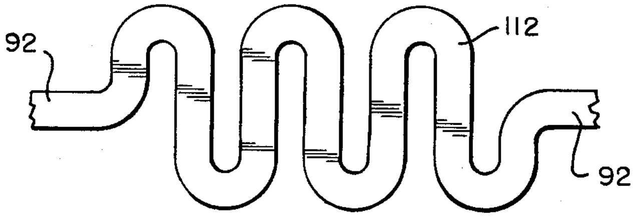
FIG. 18C
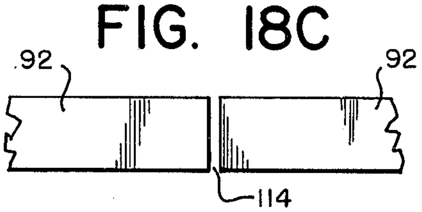
FIG. 18D
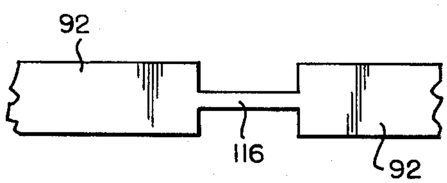
FIG. 18E
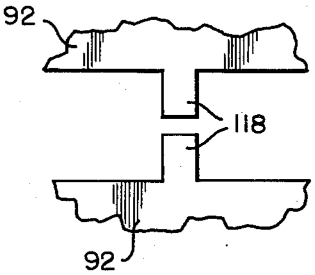
FIG. 18F
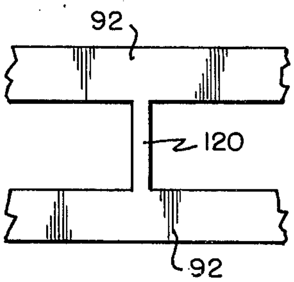
FIG. 19
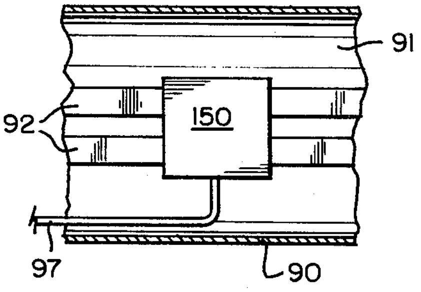
FIG. 20A
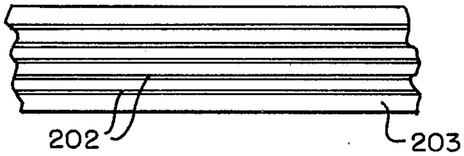
FIG. 20B
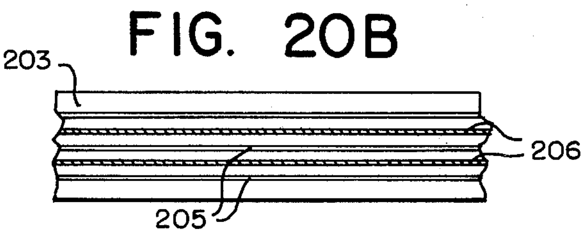
FIG. 20C
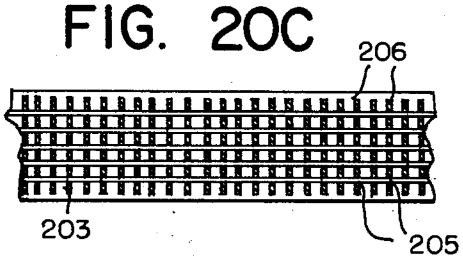
FIG. 20D
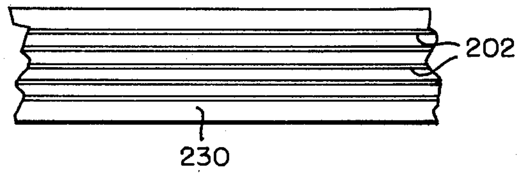

FIG. 21
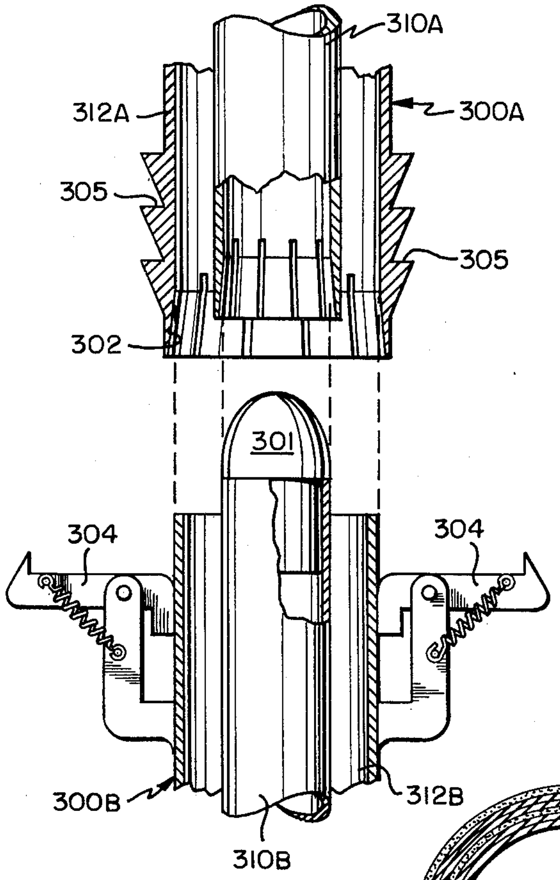
FIG. 23
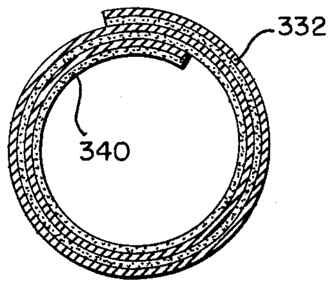
FIG. 24
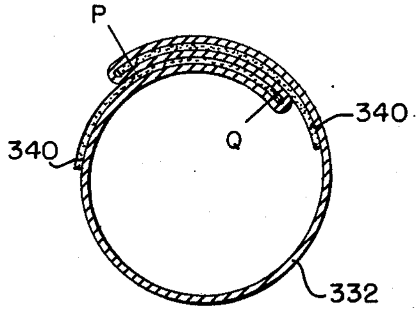
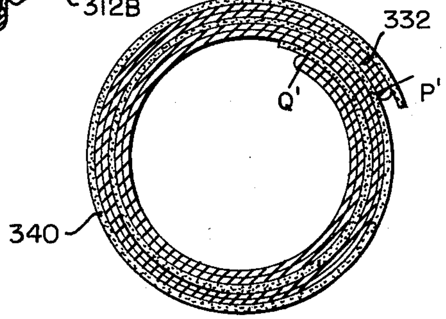
FIG. 25
FIG. 22
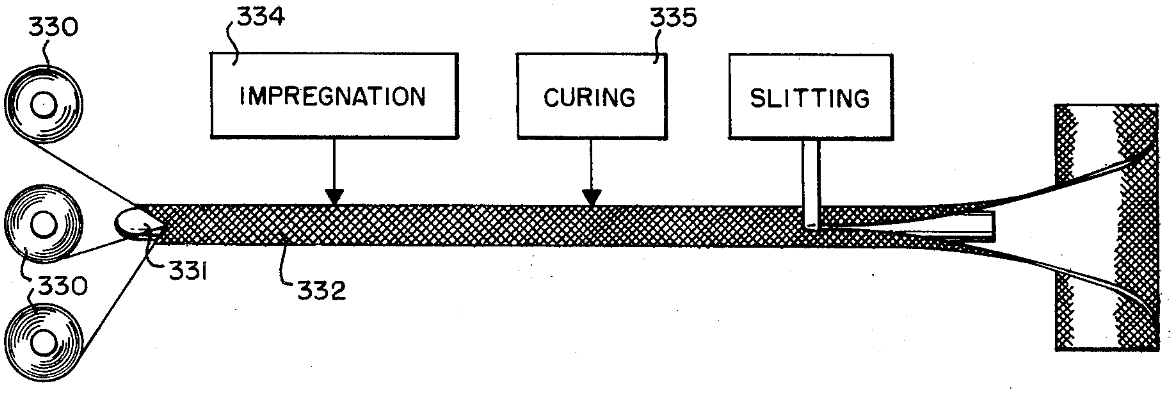

TRANSMISSION LINES USING TUBULAR EXTENDIBLE STRUCTURES

BACKGROUND OF THE INVENTION

There exists in the art a storable antenna assembly, commonly called a stem antenna, which is formed of a tubular extendible element. The tubular extendible element is made of a metallic tape which is pre-stressed or formed in a direction generally transverse to its longitudinal axis. The tape is rolled onto a reel for storage and when unreeled it curls about its longitudinal axis to form an elongated tubular structure to form a generally circular or elliptical contour which is fairly rigid and self-supporting. In some of these structures two or more tapes are interlocked and/or hinged to provide different types of cross-sections. Typical types of tubular extendible elements, which are used as stem antennas are shown, for example, in U.S. Pat. Nos. 2,157,278; 3,144,104; 3,144,215 and 3,331,075.

Prior art tubular extendible elements heretofore have been used primarily in the manner of conventional radio frequency antennas, that is, as a monopole antenna element alone or as part of an array of antenna elements, to radiate or receive electromagnetic energy. In such prior art devices, the stem antennas have been oriented either vertically, or at some other angle with respect to the ground, or have been extended from space vehicles, and the elements act as conventional long wire, or short length wire type antennas.

In my application Ser. No. 707,725, filed Feb. 23, 1968 and entitled "Storable Waveguides for Electronic Systems," now U.S. Pat. No. 3,541,568, granted Nov. 17, 1970, particular types of tubular extendible elements are shown which are used as guided wave mediums for propagating electromagnetic energy along the length of the element in various modes. Antenna radiator devices, such as horns, mushrooms, etc., are attached to these elements so that the energy propagated down the guide can be radiated from the end of the extended element in a predetermined manner. The self-supporting characteristics of the tubular extendible element, which also serves as the guided wave medium, make it possible to elevate the antenna radiator device for a considerable distance above the ground perpendicularly or at some other angle with respect to the earth's surface.

In some applications there exists a need for transmitting energy which cannot be readily propagated by waveguides. For example, it is quite conventional to transmit and propagate energy below a frequency on the order of 1,000 MHz. by using what are commonly called two-wire transmission lines. These transmission lines can take several forms, such as coaxial lines, open-wire transmission lines, so-called twin-lead transmission lines commonly used in television receivers, and many other conventional types of lines. Heretofore, such lines have been "soft" in nature, that is, they can be reeled and have little or no characteristic of rigidity in the direction of their elongation. While these prior art transmission lines function satisfactorily to propagate the energy, they are not self-supporting. Therefore, they can only be used in an elevated manner if auxiliary structure is provided to support the line. For example, in a situation where an antenna radiator is to be located above the ground it is necessary to provide a tower or a mast to support the antenna and the transmission line. Also, such prior art transmission lines cannot be run readily over open spaces, such as across a ditch or stream, without an external means of support.

A problem commonly encountered with tubular extendible elements is the change of material characteristics caused by temperature. Metal usually used for the element material will change its dimensions as it is heated or warmed, if only by solar illumination. This causes problems in environments where the element has one face exposed to the sun while the other face is in shadow. Heretofore, structures have metallic extendible elements which are to be used in applications where they will be subjected to temperature gradients have had to have provisions to compensate for the change in material dimensions caused by temperature. Some compensating provisions have been complex and costly.

SUMMARY OF THE INVENTION

The subject invention is directed to transmission lines and more particularly to self-supporting structures for two-wire transmission lines. In accordance with the invention, tubular extendible elements are utilized. The elements are arranged in such a manner and/or have additional electrical elements placed thereon to form two-wire transmission lines.

In accordance with a preferred embodiment of the invention, an arrangement is disclosed in which two tubular extendible elements are concentrically located with respect to each other to provide a coaxial type transmission line. In various modifications of this generally preferred embodiment, one or more other prestressed elements are positioned between the two extendible elements forming the transmission line to provide dielectric supporting and insulating means between the two conductors of the line.

In another embodiment of the invention, a tubular extendible element has placed thereon on a dielectric base a pair of conductors which extend in the elongated direction of the tubular element, said element being centrally positioned within an electromagnetic shield comprising a second tubular extendible element of larger diameter and with a conductive inner surface.

The transmission line structures of the present invention provide a variety of types of two-wire transmission lines which are storable, can be self-extending, and are self-supporting for substantially long lengths. Thus, they can be used in elevated environments or to span distances horizontally, where few or no auxiliary supporting members are available. The structures can be used as lines, for connecting various pieces of electronic equipment, and/or provided with an antenna radiator member or members at or near the extended end of each structure.

In addition, the present invention is directed to tubular extendible elements which utilize filamentary materials having pre-selected temperature coefficients, including materials having a substantially zero temperature coefficient. Structures are provided which are not only capable of propagating electromagnetic energy but which are also highly resistant to changes in dimension caused by temperature.

It is therefore, an object of the present invention to provide tubular extendible elements which are utilized as two-wire transmission line media.

A further object of the invention is to provide tubular extendible elements utilized as coaxial transmission lines.

Yet another object of the invention is to provide tubular extendible elements having a dielectric base on which is placed a two-wire, spaced transmission line.

An additional object is to provide a tubular extendible element having a dielectric base with a two-wire transmission line thereon including various types of electronic circuit elements.

Another object is to provide a tubular extendible element having a dielectric base on which is placed a two-wire transmission line and a second tubular extendible element which surrounds the first and has a conductive surface to provide a shield.

A further object is to provide a tubular extendible element which is operated as a coaxial line and in which a Faraday shield is provided to make an impedance match which is essentially independent of the amount of extendible material remaining on the reeling mechanism for the element.

Yet another object is to provide tubular extendible elements utilized as a coaxial transmission line having additional tubular, curved or helical extendible elements therein which operate as dielectric spacers, insulating members and supports.

A further object is to provide a tubular extendible element forming a two-wire transmission line to which an antenna may be connected.

Another object is to provide tubular extendible elements which can be made of materials having pre-selected temperature coefficients of expansion.

An additional object is to provide extendible elements used for surface wave propagation.

Still a further object is to provide tubular extendible elements and other structures in which filamentary materials having pre-selected and mutually compensating coefficients of expansion are used to provide a structure which has reduced sensitivity to temperature.

Other objects and advantages of the present invention will become more apparent upon reference to the following specification and annexed drawings in which:

FIGS. 8 and 9 are side views taken in section of other types of coupling arrangements for the coaxial line type tubular extendible element structures;

FIGS. 10A, 10B and 10C are cross-sectional views of tubular extendible elements that may be used as individual elements of coaxial line configurations;

FIG. 11 is a perspective view of a portion of a tubular extendible element coaxial line type structure having spacers in the form of additional tubular extendible elements stored on the same reel as the outer conductor for insertion between the inner and the outer conductors;

FIG. 12 is a cross-sectional view of the coaxial line of FIG. 11 showing the spacers in their final, unfurled positions;

FIG. 13 is a cross-sectional view of a coaxial line showing another type of spacing arrangement;

FIG. 13A is a perspective view of a coupling arrangement with provision for admitting insulating spacer members into the space between two coaxial elements;

FIG. 14 is a perspective view of a tubular extendible element used as a two-wire open transmission line;

FIG. 15 is a perspective view of another coupling arrangement for the open wire tubular extendible element configuration of FIG. 14;

FIG. 16 is a perspective view of a portion of a two-wire transmission line formed in a tubular extendible element having another tubular extendible element therearound for a shield;

FIG. 17 is a perspective view of a portion of the tubular extendible element used as a two-wire transmission line;

FIGS. 18A through 18F show different types of electric circuit elements which can be used with the open line configuration of FIG. 14;

FIG. 19 is a view showing an integrated circuit mounted on a tubular extendible element;

FIGS. 20A through 20D are views of extendible elements formed of composite materials;

FIG. 21 is an elevational view, in cross-section of a latching arrangement for two lines;

FIG. 22 is a view showing an arrangement for making an extendible element having good dimensional stability properties;

FIGS. 23–25 are cross-sectional views of deployable structures made which use a braided or plaited fiber cable; and FIGS. 26A and 26B are respectively a cross-section and a perspective view of an embodiment of the invention for effecting surface wave transmission while

Figure 1:
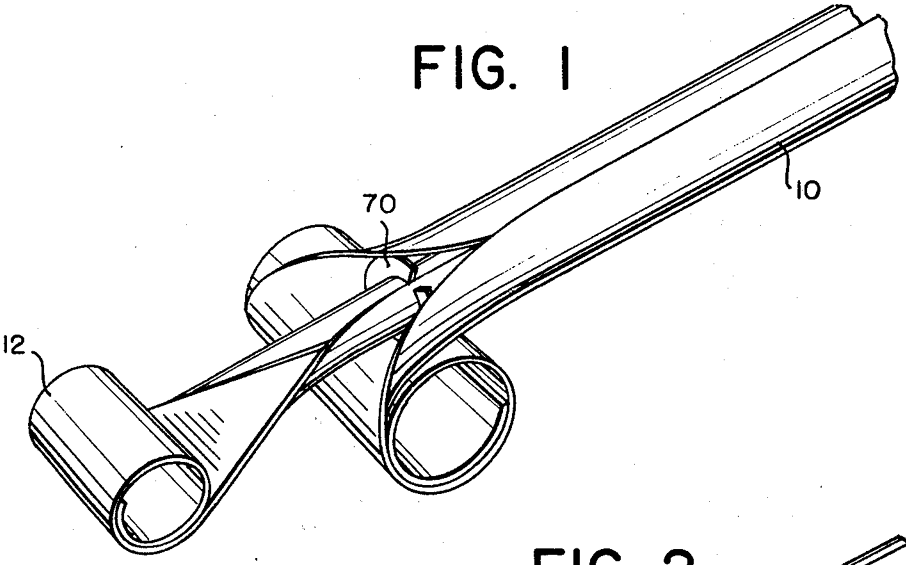
FIG. 1 is a perspective view of two tubular extendible elements used as a coaxial line structure.

Referring first to FIG. 1, a generalized form of the preferred coaxial line-type structure embodiment of the invention comprises first and second tubular extendible elements 10 and 12. Each of the elements 10 and 12 are of conventional construction and are formed, for example, of a pre-stressed composite material or metal which is rolled onto a spool (not shown) and extended therefrom by a suitable reeling mechanism. Various methods for making furlable, non-metallic but metallizable tapes can be used, for example heat treating, molding and curing under pressure and heat of composite tapes, such as carbon fibers or metal filament whiskers in a settable resin or other matrix, for example, a matrix of ceramic material. The reeling mechanisms for the tapes are also conventional in the art and, for example, are shown in the aforementioned patents and in other patents. These methods and mechanisms are not described in detail since they are conventional. In the embodiment shown in FIG. 1, both of the elements 10 and 12 may be of metallic tape material in which case the surfaces thereof may be coated with any suitable insulating or dielectric material if desired, or they may be of a dielectric material such as a fiberglass-resin composite or of another type of composite material, such as a carbon fiber-resin material in which latter cases, conductive materials may be affixed as desired.

The two elements 10 and 12 are shown partially extended in FIG. 1 and arranged coaxially with respect to each other. Element 10 forms the outer conductor of a coaxial transmission line while the inner conductor of the line is the tubular extendible element 12. The two elements are spaced from each other by a predetermined amount which is determined by the outer diameter of the inner conductor 12, the inner diameter of the outer conductor 10, and the thickness of the respective tapes. A split ring dielectric washer 70 is shown between the two elements to space them apart.

As should be apparent, the two elements 10 and 12 form a coaxial line when the central conductor formed by the element 12 is held at a predetermined spaced coaxial relationship with the outer conductor formed by the element 10. The spaced relationship can be held, within relatively good limits over a fairly long length, depending upon the selection of the materials and sizes for the elements. Arrangements for holding this spaced relationship more positively and precisely are described below.

In FIG. 1, the element 10 is rolled in a backward wound configuration, unreeling from the top of the spool, while the element 12 forming the inner conductor is in a forward wound configuration. This is merely illustrative of the types of wound extendible elements which can be used. For example, a pair of backward-wound elements, one inside the other, can be used as well as a pair of forward-wound elements.

Figure 2:
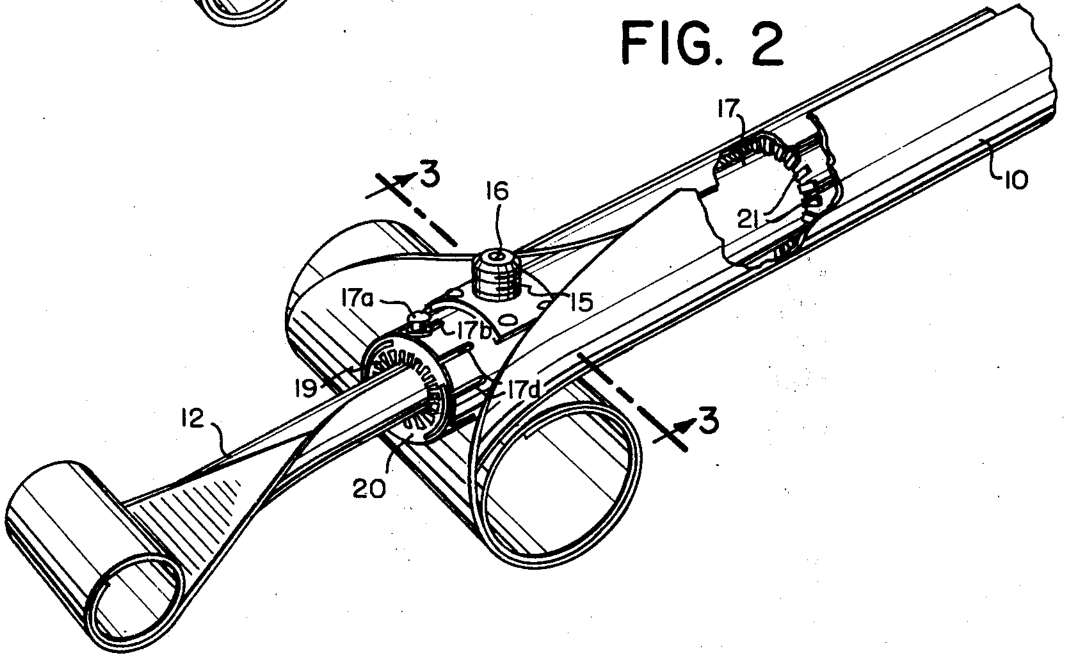
FIG. 2 is a perspective view of two tubular elements used as a coaxial line structure showing a radio-frequency energy coupling connection for the fixed end of the line.
Figure 3:
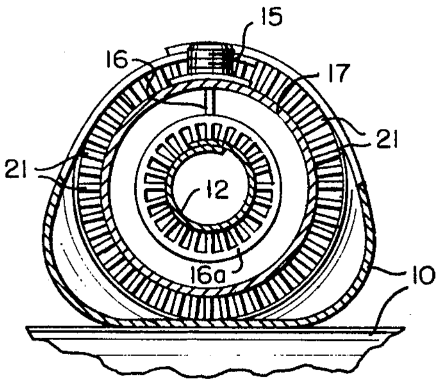
FIG. 3 is a cross-sectional view taken along lines 3—3 of FIG. 2.

FIGS. 2 and 3 show one arrangement for coupling energy into a coaxial line structure formed by a pair of tubular extendible elements. Here, a standard coaxial connector 15 is mounted to the outer surface of a transition element 17 which is in the form of a tube of conductive material. This tube 17 can be solid, or hinged along its length, or it also can be a short section of a pre-stressed tape of the type used for the two elements 10 and 12. The latter two configurations permit the tube 17 to be slipped over the inner element 12 at the appropriate point of unreeling, and can simplify the replacement of damaged extendible elements.

In the embodiment of FIGS. 2 and 3 at least the outer surface of element 12 and the inner surface of element 10 are of conductive material, if the two tapes are not made fully of conductive material. At the entrance end of the two elements 10 and 12, is positioned a shorting disc 20 of sturdy construction and conductive material, formed either of one piece or of two mated but separable pieces, and electrically connected to one end of the tube 17. A snug, force fit type contact is ensured by a series of longitudinal slots **17*d* in tube 17. A set screw and washer assembly 17*a* operating in conjunction with a slot 17*b* in the tube permits the shorting disc 20** to be moved longitudinally and, finally, locked in place. This adjustment permits maximum energy transfer at different operating frequencies.

The disc 20 has radially inward extending spring fingers 19 to make electrical contact with the outer conductive surface of the inner conductor formed by element 12. Outwardly extending spring fingers 21 are formed on the end of the transition tube 17 within element 10. The fingers 21 make electrical contact with the inner conductive surface of the outer conductor of the coaxial line formed by element 10. Where the transition element 17 is itself made of conductive tape or other springy conductive material, the fingers 21 can be cut and bent from the ends of the element. A coaxial connector 15 is provided which has an inner central conductor 16 which passes through an opening in the transition element 17 and is electrically connected to the inner conductor element 12, preferably by a conductive spring contact 16(FIG. 3). The common, or ground portion, of the connector 15 is electrically connected to the transition element.

The length of the transition element tube 17 between the center conductor 16 of the coaxial connector 15 and the spring fingers 19 engaging the inner conductor 12 can be approximately one-quarter wavelength long at the frequency of the energy supplied to the line to form a conventional quarter-wave transition section in the coaxial line. To supply energy to or extract energy from the coaxial line structures it is only necessary to connect a suitable mating connector to the coaxial connector 15 and supply the energy thereto to extract energy therefrom. This energy can come from or be conveyed to any suitable device. For example, the energy can be supplied from a radio transmitter and/or the coaxial line structure can supply energy to a radio receiver.

Figure 4:
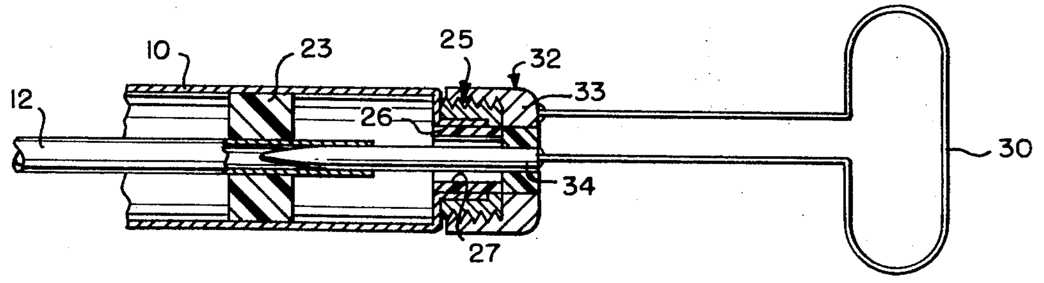
FIG. 4 is a cross-sectional view of an end of a coaxial line type tubular extendible structure showing a radio-frequency energy coupling connection and an antenna radiator connected to the free, or deployable, end thereof.

FIG. 4 shows a cross-section of an arrangement for the coaxial lines of the subject invention at the ends remote from the unreeling mechanism which can be used with the embodiment of FIGS. 1–3 and other embodiments. An annular spacer 23 of dielectric material is located between the two elements 10 and 12 to maintain a desired spatial relationship and also to provide support between elements 10 and 12 at the end of the coaxial line. A coaxial type connector 25 has its outer common threaded portion electrically connected to the conductive surface of outer element 10. The insulated portion 26 of the connector 25, usually housing the connector's central inner conductor, is left open as a bore 27.

An antenna 30, illustratively shown in the form of a simple loop, is mounted to a second coaxial type connector 32. The end of one lead to the loop is electrically connected to the common portion 33 of the connector 32 and the end of the other lead is connected to a peg 34 of conductive material having a lower tapered end. The coaxial connector 32 is screwed onto the mating connector 25 with the end of the peg 34 providing a force fit into the end of the element 12. Peg 34 may also be tapered in a stepwise fashion or in a continuous fashion to provide any desired impedance transformation, between the coaxial line and the antenna. In either case an electrical circuit is completed to the antenna. Alternatively, a rigid or flexible coaxial cable can be connected to connector 32, to conduct energy to or from a remote antenna.

In deploying the antenna 30 of FIG. 4, the connector 25 and the antenna 30 with its connector 32 can either be attached to the coaxial line structure in advance or, if desired, after both elements have been unfurled or deployed a short distance. The complete structure can be deployed to a great height as the elements are unreeled to form an extended self-supporting structure. The coupling to the antenna 30 at the input end of the line structure can be as previously, or hereafter, described. As a further alternative, the spacer 23, connectors 25 and 32 and the antenna radiator 30 can be packaged together as a complete unit to fit over the ends of elements 10 and 12. While a simple loop type antenna 30 is shown, other types of antenna radiators can be used, such as horns, monopoles, dipoles, etc. With suitable coupling techniques, as, for example, the quarter-wave coupling shown in FIG. 5, any desired type of radiator can be used either through direct attachment or by means of an interconnecting section of coaxial cable, etc. Also, any suitable type connectors 25,32 can be utilized.

Figure 5:
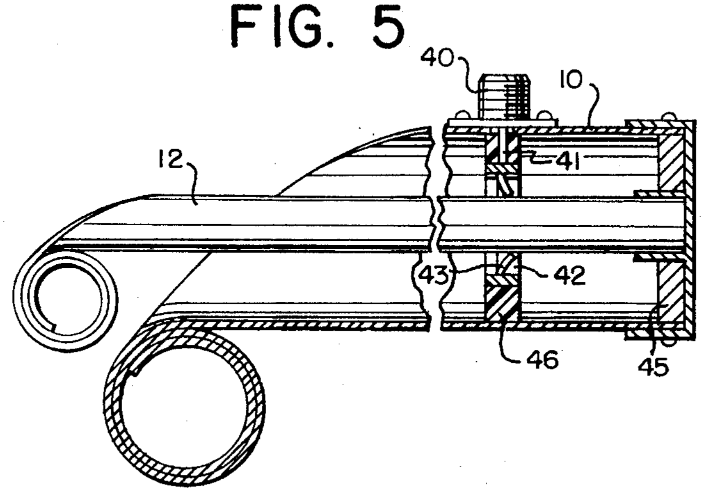
FIG. 5 is a fragmentary view of a portion of a coaxial line showing another coupling arrangement.

FIG. 5 shows another arrangement for supplying energy into or coupling energy out the free extended end of a coaxial line structure of the type shown in FIG. 1. Here a coaxial type connector 40 has its outer conductor electrically connected to the outer surface of the outer tubular element 10. In this case, at least the outer surface of element 12 and the inner surface of element 10 are conductive. The connector's center conductor 41 extends through a hole in the outer element 10 and is electrically connected to an annular ring 42 of electrically conductive material having a number of spring fiber contacts 43 extending from its inner surface. The ring 42 may be additionally supported by a dielectric supporting ring 46 which engages the inner surface of outer element 10. The spring fingers 43 electrically connect the center conductor 41 to the outer surface of the inner tubular element 12. A terminating, shorting thimble 45 is provided to make electrical contact with the outer surface of inner tube 12 and the inner surface of outer tube 10, which in this case is conductive. The end of the thimble 45 is typically positioned a quarter wavelength, or any odd multiple thereof, from the feed connector 40. An antenna or other suitable device can be coupled to connector 40.

Figure 6:
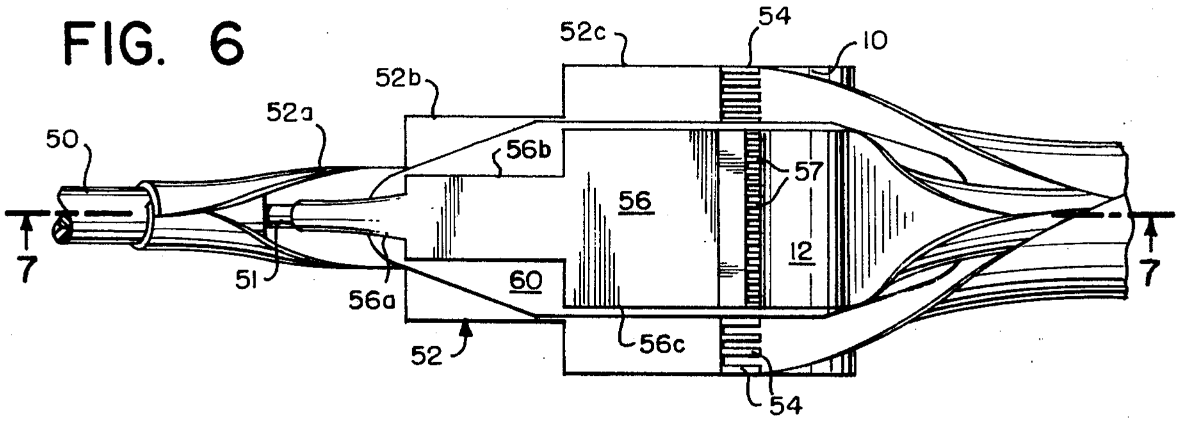
FIG. 6 is a top view showing another coupling arrangement to the tubular extendible coaxial line structure.
Figure 7:
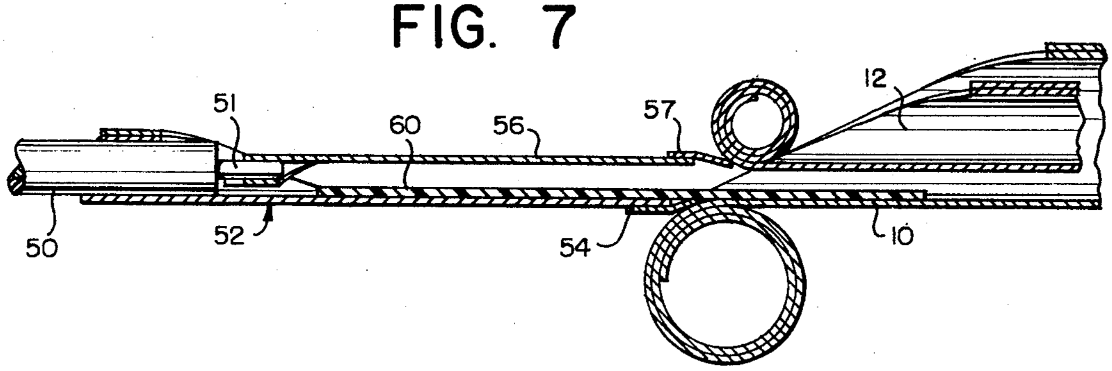
FIG. 7 is a cross-sectional view taken along the line 7—7 of FIG. 6.

FIGS. 6 and 7 show another feed arrangement for the coaxial line structures of the present invention. Here, the line coupling to the fixed end of the structure is shown as having an outer conductor 50 and an inner conductor 51. A first transition section 52 is provided in the form of a flat rectangular member of stepped configuration of increasing area from the line 50 toward the outer tube 10. The steps 52*a*, 52*b*, and 52*c* are selected of relative sizes to form a matching transformer, each step typically one-quarter wavelength long, as is known in the art. The narrow end 52*a* of the transition section 52 is connected electrically to the outer conductor 50 of the input feed line. The terminal end portion 52*c* of section 52 has a plurality of spring fingers 54. The spring fingers 54 contact what will be the inner surface of the extended tubular element 10 (see FIG. 7). In this case, at least the inner surface of element 10 is electrically conductive. A transition section 56 similar to section 52 has its narrow input end electrically connected to the inner conductor 51 of the feed line and has a number of spring finger contacts 57 at its wider end. The spring fingers 57 contact the outer surface of the element 12, which, in this case, is conductive. The two transition sections 52 and 56 are separated from each other by a piece of dielectric material 60, the whole comprising a parallel transmission line. The sections 52 and 56 match each other in length but section 56 is of lesser width. With this coupling arrangement, a balun is required. In the configuration shown, the gradual taper to the final coaxial configuration serves as a balun. Other types of baluns, many of which are known in the art, may also be used. If desired, the section 52*a* and its corresponding center-conductor section 56*a* can be made to act as a balun, so that the parallel transmission line will be a balanced transmission line, by, for example, making them both long and tapering 52*a* to the approximate width of the strip section 56*a*.

FIGS. 8 and 9 show another coupling arrangement for the coaxial line structure according to the present invention in which a Faraday shield type of coupling arrangement is utilized. The outer and inner conductors 50 and 51 of the coupling line are again shown in both Figures. In the embodiment of FIG. 8 the outer tubular element 10 is stored in rolled form within a cassette 65 which has an exit slit 66. The inner tubular element 12 is stored within a second cassette 68 having an exit slit 69. Both cassettes 65 and 68 are made of a suitable electrically conductive material so that they completely electrically shield the respective tubular element 10 or 12 located therein. As shown in FIG. 8, the cassettes 65 and 68 are separated by the dielectric member 60 which here serves additionally as a support for the two cassettes. The mounting of the cassettes to piece 60 can be accomplished by any conventional means, for example a suitable adhesive. The drive members for the cassettes 65 and 68 which are needed to unreel the tapes stored therein are not shown. However, they can be any suitable mechanical or electromechanical drive arrangement. They may also include directional clutching means to support the extended structures, etc.

The cassette 65 for outer element 10 has spring finger contacts 67 adjacent its exit slit 66 while the casette 68 for inner element 12 has spring finger contacts 70 adjacent its exit slit 69. In this case, at least the outer surface of element 12 and the inner surface of element 10 are conductive. An electrically conductive connection is made by a wire or a suitable transition element, for example such as the element 52 of FIGS. 6–7, between the outer conductor 50 of the input feed line and the cassette 65 holding the outer element 10. A similar electrically conductive connection is made by either a wire or a transition element, such as the element 56 of FIGS. 6–7, between the end of the inner conductor 51 and the cassette 68. Where transition elements of the type such as 52 and 56 are used, the spring fingers shown in FIGS. 6 and 7 are not needed since a fixed electrical connection is made to the cassettes.

As should be apparent, the outer and inner elements 10 and 12 supply energy to, or are supplied with energy from, the respective outer and inner conductors 50 and 51 of the coupling line through the two transition elements 52 and 56, the respectively connected shielded cassettes 65 and 68 are their respective spring finger contacts 67 and 70. Thus, each element 10 and 12 supplies energy or is supplied with energy through the Faraday shields formed by the electrically conductive cassettes. This greatly simplifies the impedance matching problem as is well-known in the art.

FIG. 9 shows another feed arrangement using Faraday shields in which the reference numerals for similar parts used in FIG. 8 are also used. Here, a slightly different mounting arrangement is used in that the cassettes have a more conformed configuration to conserve space. The two cassettes 65 and 68 are mounted on opposite sides of the dielectric piece 60, which now has a curved end 60*a* with the cassette 68 for the inner conductor 12 on top. The curved end 60*a* of the dielectric support conforms to the general outer shape of both of the cassettes and the two cassettes are fastened to the dielectric. Also, in this case, the spring fingers for the topmost cassette have been omitted and, instead, that cassette has springy lips 68*a* through which the extendible element 12 exits and an electrical contact is made.

The transition elements 52 and 56 are again shown for connecting the input conductors 50 and 51 to the electrically conductive cassettes. Cassette 65 has its rear end suitably electrically connected to the transition section 52 at 65*b*. Transition section 56 is electrically connected between an end of the inner conductor 51 of the coupling line and the outer surface of the cassette at point 68*b*.

Figure 9A:
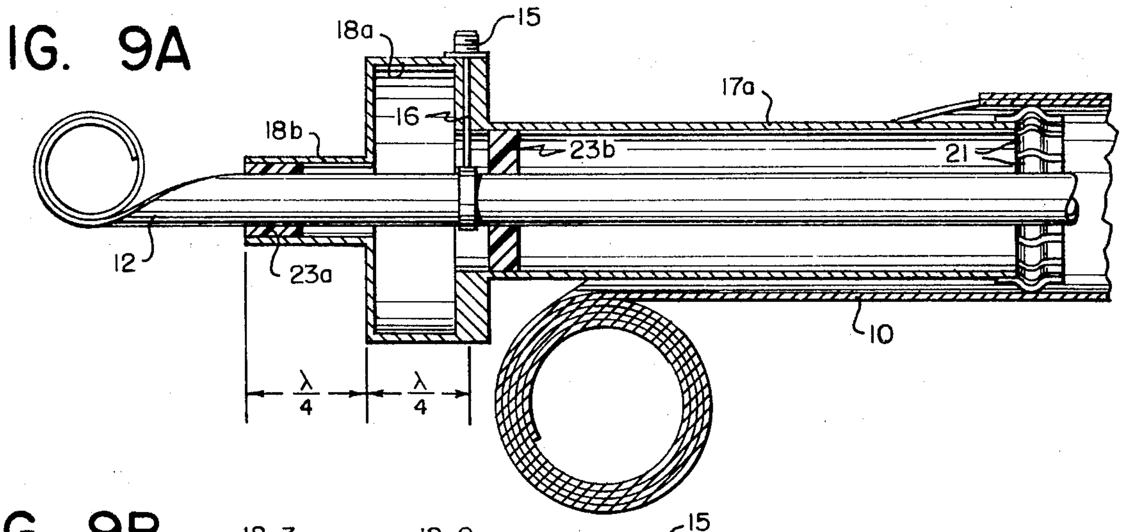
FIGS. 9A, 9B, 9C and 9F are views showing cavity type broadband coupling systems.

FIG. 9A shows an arrangement for broadbanding the coaxial coupling means. The arrangement follows FIG. 2 in that a transition section 17*a* is used. The rear portion of section 17*a* is extended to form two conductive wall cascaded cavities 18*a* and 18*b*. Each of the cavities is approximately one-quarter wavelength long at the nominal band center of the operating frequency. Cavity 18*a* is of high impedance as compared to the lower impedance of cavity 18*b*.

The inner tubular element 12 enters an opening in cavity 18*b* and is held out of contact with the cavity entrance by a dielectric support 23*a*. As many of these supports as needed can be used. A connector 15 is provided at the end of the high impedance cavity 18*a* adjacent the transition section. A lead extends from the central conductor of the connector through a hole in the thickened front wall of cavity 18*a* to make electrical contact with element 12. A second dielectric support 23*b* is shown between the point of contact of the connector lead with element 12 and the end wall of cavity 18*a*. The supports 23*a* and 23*b* would not be used in most cases. Instead their functions would typically be served by furlable, deployable dielectric members inserted through the open end of cavity 18*b*, where 23*a* is now shown. Spring finger stock 21 at the end of the transition section makes electrical contact with the inner surface of outer tubular element 10 which is of a diameter substantially the same as that of transition section 17*a*.

As should be apparent, the two cavities 18*a* and 18*b* of FIG. 9A form an impedance transformer having two quarter wavelength sections with an open circuit at the point where inner element 12 enters the cavity and, because of the two quarter-wave sections, a high-impedance open circuit, high due to the high impedance of cavity 18*a*, at the point where the connector 15 supplies energy to inner element 12.

The cavity arrangement of FIG. 9A can be extended to any number of cascaded sections to further broaden the bandwidth of the energy coupling. Where an even number of quarter wavelength cavity sections are used the inner element 12 is non-contacting at the point of entry into the cavity system, as in FIG. 9A. Where an odd number of quarter wavelength cascaded sections are used the inner element 12 should be in electrical contact with (shorted to) the cavity system at the point of entry. In those cases where electrical contact must be made, arrangements such as those shown below, in FIGS. 13A, 13B, 13C and 13D, as well as other figures, can be employed to permit the insertion of furlable, deployable dielectric space members between elements 10 and 12. The impedance of each cavity, as determined by its respective size, is selected to achieve the desired impedance to broadband the coupling.

Figure 9B:
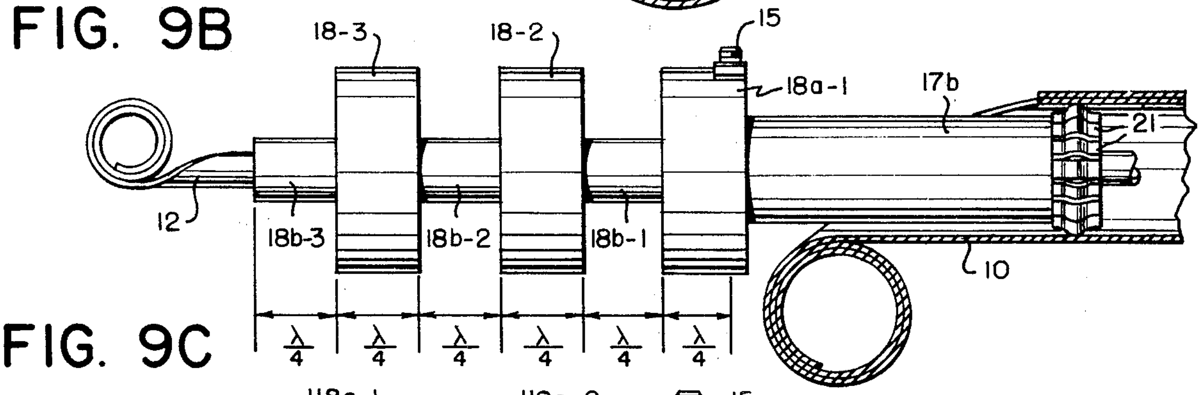

FIG. 9B shows a coupling arrangement of six cascaded quarter wavelength cavities. Three high-impedance cavities 18a-1, 18a-2 and 18a-3 are provided and there are three low-impedance cavity sections 18b-1, 18b-2 and 18b-3. The inner element 12 enters the cavity system through the end low-impedance cavity 18b-3. Since there are an even number, six, of cavity sections the element 12 is not conductively connected to cavity 18b-3 at the point of entry into the cavity system.

The cavity system of FIG. 9B has relatively wide bandwidth for the energy coupling since six sections are used. If desired, the diameters of various cavities of the system can be varied to achieve the desired impedance characteristics for the coupling system. Further, the inner element 12 can be supported by dielectric spacer members within the cavity system. These spacers can additionally feed into the coaxial line structure to separate elements 10 and 12. This is described below with respect to FIGS. 11, 12, 13, 13A, 13B and 13C as well as other figures.

Figure 9C:
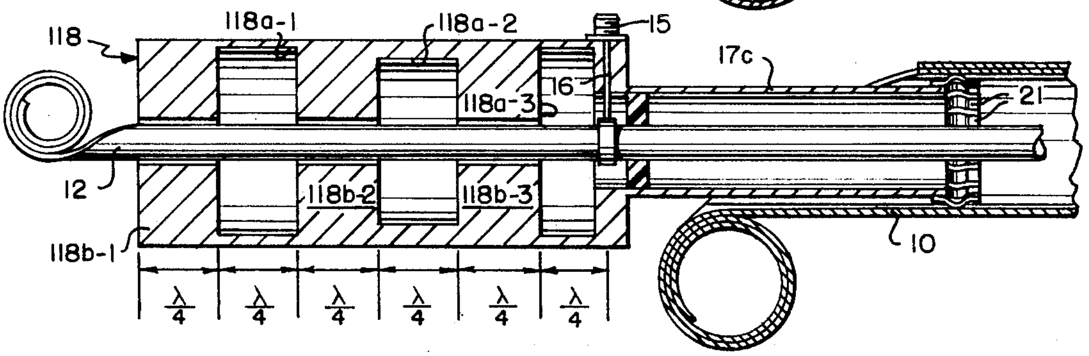

FIG. 9C shows another broadband coupling arrangement. Here the coupling system is formed by an outer tube 118 of constant diameter. The tube 118 has a number of high impedance quarter wavelength sections 118a-1, 118a-2 and 118a-3 which are cascaded with low impedance quarter wavelength sectons 118b-1, 118b-2 and 118b-3. The low impedance sections 118*b* are annular extensions of tube 118, that is, they extend closer to the inner element 12. The high impedance sections 118*a* are sections of the tube spaced further away from inner element 12.

In FIG. 9C, the connector 15 is electrically connected to the inner element 12 at the input end of the transition section 17*c*. The transition section has spring finger stock 21 which electrically contacts the inner surface of outer element 10. Since the coupling system of FIG. 9C has an even number of sections, inner element 12 is kept fom making electrical contact with section 118b-1. If an odd number of sections are to be used, the element 12 would be in electrical contact with the outer (leftmost) edge of section 118b-1. As before, dielectric spacers can be used for support of element 12 within the feed system, and subsequently, within the coaxial line itself.

Figure 9D:
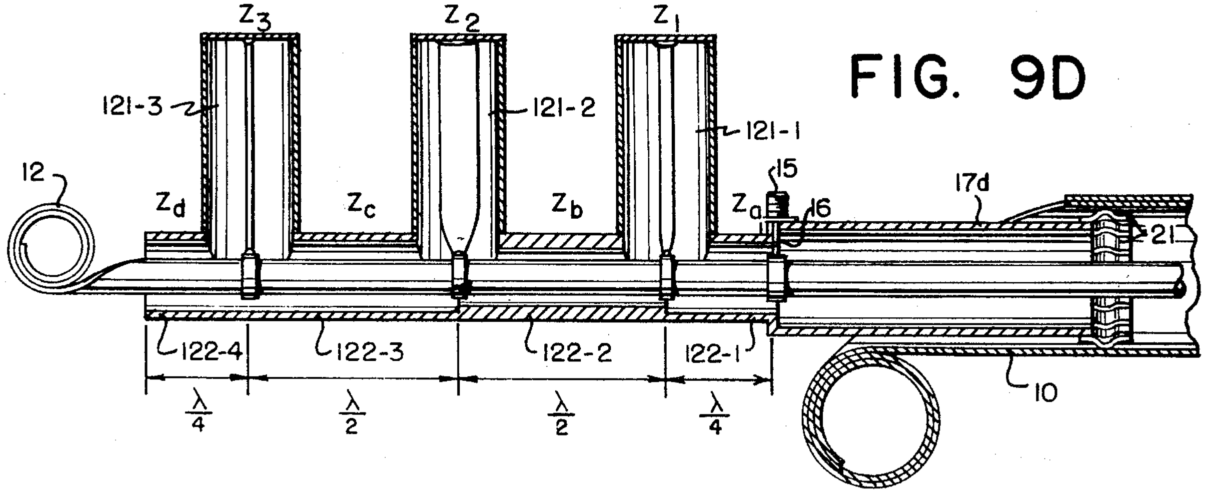
FIGS. 9D and 9E are views showing stub arrangements for broadbanding the coupling system.

FIG. 9D shows still another coupling system. Here, the transition section 17*d* is loaded with cascaded tuning stubs of different impedances. Starting from the input end of inner element 12 into the coupling system 120, there is a quarter wavelength section 122-4 of impedance $Z_d$. The element 12 makes electrical contact with the center element of a shorted half wavelength coaxial stub 121-3 of impedance designated $Z_3$. There is then a half wavelength section 122-3 in the line of impedance $Z_c$ between stub 121-3 and another half wavelength stub 121-2 of impedance $Z_2$ which is electrically connected to element 12. There is a further half wavelength section 122-2 in the line of impedance $Z_b$ between stub 121-1 of impedance $Z_1$ which also contacts element 12. The system ends in a quarter wavelength line section 122-1 of impedance $Z_a$ between stub 121-1 and the transition section 17*d*.

A connector 15 makes electrical contact with the outer surface of inner element 12 at the input end of the transition section. The output end of the transition section makes electrical contact with the inner surface of the outer element 10. The effect of the coupling system is to load the transition section 17*d* to achieve the desired broad bandwidth for the coupling.

In FIG. 9D, the tuning stubs can be selected to have varying lengths and impedances, in a manner well known in the art. There can be other than quarter and half wavelength spacing between the stubs between the input end of the feed system and the transition section. In effect the system is designed as filter which presents a broadband open circuit to the input reference terminal, that is, the energy coupling point at connector 15 to the inner element 12. It also should be understood that the tuning stubs 121 can be a quarter wavelength. In the latter case the stubs would be open-circuited at their ends.

Figure 9E:
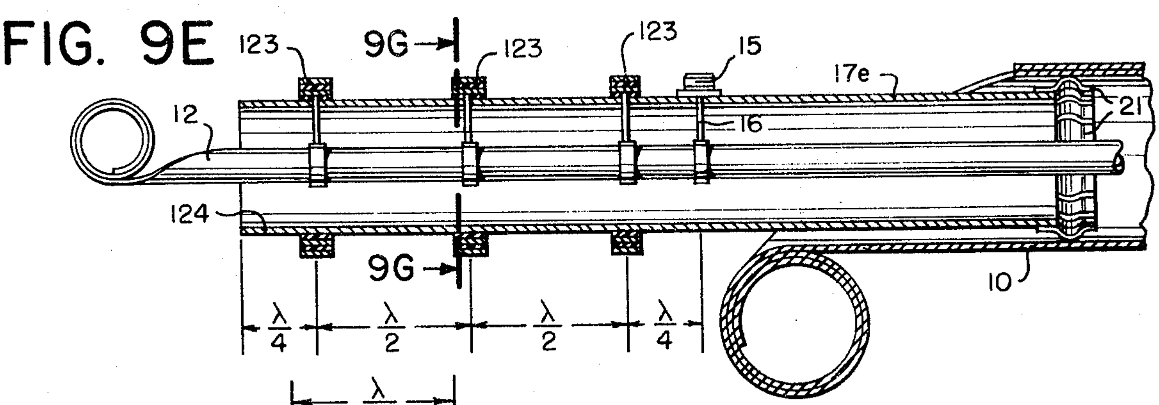

FIG. 9E shows a coupling arrangement similar to that of FIG. 9D. Here, instead of using elongated tuning stubs, strip lines 123 are used. These strip lines are formed by alternate layers of dielectric and metal, there being two of each such layers as shown, with the inner dielectric layer being adjacent the tube 124 which supports the structure. The lengths of the strip lines 123 can be one quarter or one-half wavelength long. In the former case they are open circuited and in the latter case short-circuited. FIG. 9G illustrates the latter case. The width of the striplines and the thickness of the dielectric layers are selected to achieve the desired impedances. The spacings between the strip line stubs are selected as needed to present the broadband open circuit to the input reference terminal of coupling connector 15.

Figure 9F:
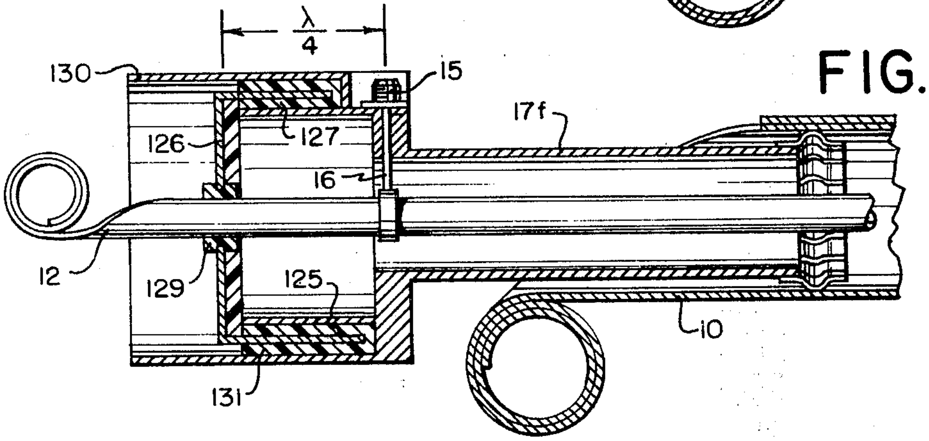
Figure 9G:
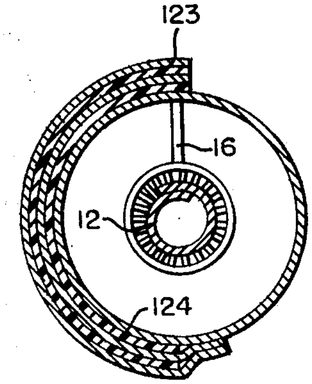

FIG. 9F shows still another coupling system which is a type of inter-fold cavity filter. An inner cavity section 125 of conductive material in the form of a cup is provided. An outer cavity section 126 of conductive material in the shape of a cup fits over the first cavity section 125 and is separated therefrom by dielectric spacers 127. Element 12 passes through an opening in one wall of cavity section 126 spaced therefrom by a dielectric member 129. The opposite wall of cavity section 125 is open so that element 12 can pass through to transition section 17*f* which is connected to the wall of section 125. The spacing between the opposing walls of cavities 125 and 126 is one-quarter wavelength to provide a cavity structure.

The structure of FIG. 9F is completed by an outer sleeve 130 which is electrically connected to cavity section 125 on the wall connected to transition section 17*f*. Sleeve 130 is separated from cavity section 126 by a dielectric member 131. Sleeve 130 extends rearwardly toward the input end of the structure and past the wall of section 126 which holds dielectric member 129. This provides a shield. The peripheral wall of cavity section 125 has an opening to accept the connector 15 of the signal coupling line which supplies, or extracts, the signal energy by way of its connection to the outer surface of inner element 12. The back plate of cavity section 126 can be designed to accept only the dielectric member 129 or to accept dielectric spacer members to help support inner element 12 within the cavity. Although the preceeding coupling arrangements are commonly called feeds, they serve equally well to couple out of the coaxial transmission line radio frequency energy that entered the line at its free end, as from an attached antenna.

FIGS. 10A, 10B and 10C show different and typical configurations that the inner or outer conductors of the coaxial line structures formed by the tubular extendible elements in accordance with the present invention can utilize. With the structures heretofore described with respect to FIGS. 1 through 9 use two elements which form two generally circular closed configurations, many other types of configurations can be utilized.

As shown in FIG. 10A the outer tubular element or the inner tubular element can be formed by two tape pieces 1A and 2A that are not completely closed upon one another. In this case the diameters of the two tapes are selected so that they abut each other and form a closed surface. The openings in the respective pieces 1A and 2A are spaced approximately 180° from each other. Only one of the pieces need be made conductive and supplied with energy, the other being non-conductive. In general, this configuration will require a quite narrow opening to prevent leakage of energy. Alternatively, both pieces can be made conductive. Either arrangement forms a highly rigid structure. The second element (not shown) can be placed within the opening shown or around the element.

In FIG. 10B, two tapes 1B and 2B which form either of the tubular extendible elements 10 or 12 are prestressed in such a manner that when they curl they make more than one full turn back upon themselves in a spiral configuration. Thus, there are two interwound spirals with the elements in contact. Here again, only one of the pieces need be made conductive. This also forms a rigid structure.

In the embodiment shown in FIG. 10C, the outer tape piece 1C is formed of a tape which when curled closes back upon itself to slightly more than 360° while the inner piece 2C has an opening between its edges when curled. Both pieces form a highly rigid structure. As in FIG. 10A, one or both pieces can be made of conductive material. In the embodiments shown in FIGS. 10A and 10C the openings in 1A and 2A, and 2C, respectively, can be made as small as desired through selection of the tape width and the structure diameter.

A coaxial line structure using two tubular extendible elements should preferably have these elements maintained in a concentric relationship. This can be accomplished in several ways. First, if the length of the coaxial line is short enough, then the rigidity of the two tubular elements can be relied upon to maintain the spaced concentric relationship. Another way to achieve concentricity is to fasten at intervals on either the outer surface of the inner conductor 12 or the inner surface of the outer conductor 10 strips of a suitable dielectric material. The strips would have the necessary thickness to maintain the desired spacing. Thus, when the two tubes curl the dielectric strips would form the spacer. Of course, such an arrangement would greatly increase the packing volume requirements for the spool having the dielectric spacers. The volume requirements are lessened if short sections of pre-stressed furlable dielectric tape are used as spacers, but this requies rather complex arrangements to permit the unreeled structure to be reeled up again.

As another way of providing the spacing, spacers can be placed around the inner conductor 12 as the coaxial line is being formed. Thus, for example, referring back again to FIG. 1 a dielectric spacer in the form of a flexible split ring 70 can be placed around the inner conductor 12 at the point where it goes within the outer conductor 10. The spacers could be payed out from a separate spool or other storage element where they might for example be stored as appendages to a continuous flexible spine. They would move along with the coaxial line as it is being extended from the fixed end. Such an arrangement has the advantage that it does not appreciably increase the volume of the undeployed structure. However, it does require an additional operation during the erection of the coaxial line structure. In this case, a coupling arrangement of the type shown in FIGS. 6–9 is preferred.

FIGS. 11 and 12 show another arrangement for providing the desired spacing. Here, the outer tube has placed on its inner surface a number of elongated dielectric strips, 80. The strips 80 which are as long as the elements 10 and 12 are also pre-stressed so that when released each one curls to form a separate tubular structure. The dielectric strips 80 remain in a flat condition while the conductor 10 is reeled onto its spool. Upon extension of the pre-stressed outer conductor 10 it will curl as will the individual, pre-stressed dielectric strips 80. When this occurs, each of the strips 80 in turn forms a smaller tubular extendible element, as shown best in FIG. 12. The size of the dielectric strips 80 and their pre-stressing requirements are selected to maintain a desired spacing between the outer and inner conductors 10 and 12. Any suitable dielectric can be used for the elements 80, for example, furlable fiberglass tubes, etc.

As shown in FIGS. 11 and 12, the strips 80 are arranged in layers, there being three sets of strips 80. At the remote end of the element (not shown) the nine strips 80, at that point tubular in form, are arranged to be substantially equispaced and, along with element 12, are fixed in the relative positions shown in FIG. 12 before deployment commences. Thus, when the elements are deployed, the desired separation, established by the relative positioning at the remote end, will be maintained.

The dielectric strips 80 may also be wound onto a separate spool or spools and deployed simultaneously with the inner and outer elements. The strips 80 may also be pre-stressed to assume a helical shape upon deployment as illustrated by strip **80*a* in FIG. 12A, in which case they would have to be wound onto a separate spool because of the differences in length between the helical strips 80*a* and elements 10 and 12. Such helical strips can be formed by, for example, curing under heat and pressure a resin-impregnated dielectric tape wound helically on a tubular form. The resultant stressed material can be wound flat in a roll. When unfurled, it assumes the helical shape. A number of strips 80*a* may be used in a manner similar to the strips 80.**

FIG. 13 shows a cross-section of another arrangement used for maintaining the spacing between the outer and inner conductors 10 and 12. Here a number of strips 82 of pre-stressed dielectric material, illustratively shown as four, are admitted into the space between the outer conductor 10 and inner conductor 12. Upon deployment, these strips 82 curl partially inwardly toward the inner element 12 in curved configuration in the manner shown in FIG. 13 to contact both elements and provide the desired spacing.

FIG. 13A shows an arrangement for feeding the spacer members, such as 80 of FIG. 11 and 82 of FIG. 13, into the space between the two members 10 and 12. Here, coupling means of the type shown in FIG. 2 are preferably used. A number of slots 85 are formed in the shorting plate 20. Here, the separators are shown as coiled tapes of pre-stressed dielectric material 86 which are also fed by a suitable reeling mechanism (not shown). When the tapes 86 are released between the two elements 10 and 12 they assume the shape dicated by the pre-stressing, that is, one or more full curls (such as in FIG. 12), one or more inward curves (such as in FIG. 13) or one or more outward curves (not shown). The slots 85 can be of a shape which partially conforms to the final shape of the member 86 to aid in infurling. There can be as many slots 85 and members 86 as desired. Also, it is possible to feed two or more members 86 through a single slot 85.

Figure 13B:
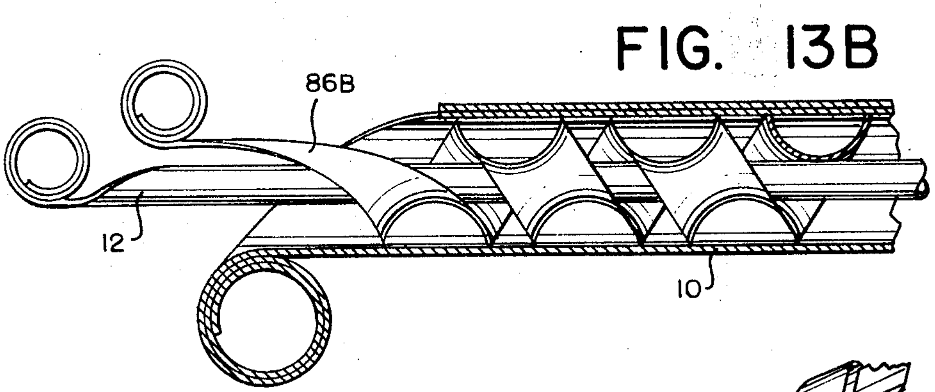
FIG. 13B is a plan view partly in cross-section of another form of spacer member.
Figure 12A:
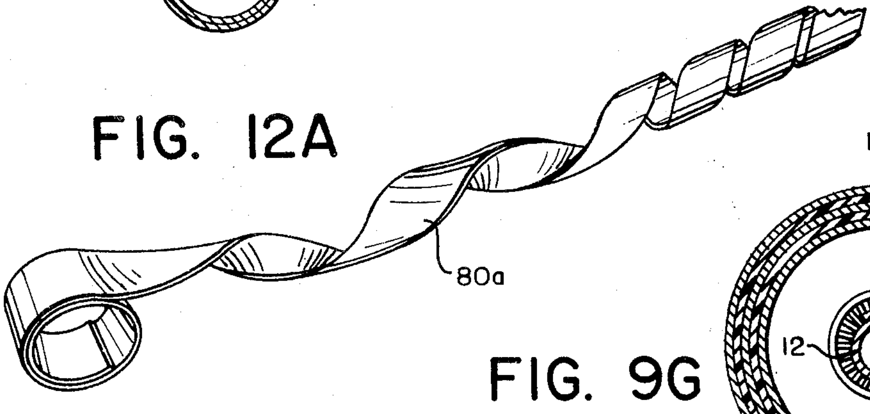
FIG. 12A is a perspective view of another type of spacer strip which can be used as a support member, as in FIGS. 11 and 12.

FIG. 13B is a view showing another type of spacer arrangement. Here a dielectric member 86B is used which is prestressed to curve in a helical form when unfurled. The member 86B is also pre-stressed so that it curves, when viewed in crosssection, to have a concave shape. The edges of dielectric member 86B contact the inner surface of the outer element 10 while the peak of the curved surface of member 86B contacts the outer surface of inner element 12. This provides an arrangement between the two elements 10 and 12 which not only increases the overall strength of the deployed structure but maintains the proper separation therebetween. Member **86*b*, here shown concave, can as readily be formed to be convex upon deployment. Furthermore it can be formed of sufficiently wide material and pre-stressed to form a substantially closed tube upon deployment. The member 86B can be fed into the space between the two elements 10 and 12 in the same manner as described with respect to FIG. 13A.**

Figure 13C:
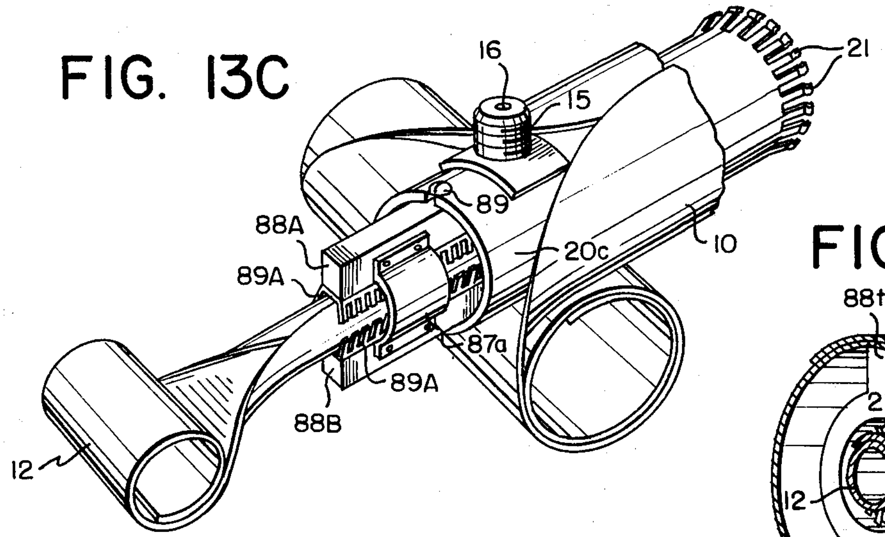
FIG. 13C is a perspective view of another embodiment of a coupling arrangement, with a different provision for admitting spacer members.

FIG. 13C shows another type of coupling arrangement which provides easier access to the space between the two elements 12 and 10 so that dielectric spacer members such as 80, 80A, 82, 86 and 86B can be admitted with greater facility. A transition section 20C is provided. A pair of solid shorting bars 88A and 88B are provided which are attached to the end of the transition section, such as by screws 89 and a corresponding bottom screw (not shown). The inner faces of the bars 88 have spring finger stock 89A along their lengths which contact the outer conductive face of the inner element 12. The end of transition section 20C has spring finger stock 21 or other suitable contacting means to contact the inner conductive face of the outer element 10. The dielectric spacers can be fed into the structure in the space between the inner element 12 and the transition section 20C. The bars 88A and 88B can be joined, as with curved plates **87*a* on opposite sides of bars 88A, 88B. Then when their depth of insertion into the transition section 20C is adjusted, the two bars can be moved as one. Their interior ends will typically be positioned one-quarter wavelength from the center contact of coaxial connector 16.**

Figure 13D:
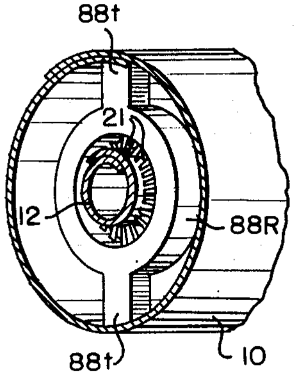
FIG. 13D is a perspective view of a transition section for still another arrangement for admitting spacer members.

In FIG. 13D still another embodiment of a shorting bar arrangement is shown. An annular disc 88R of electrically conductive material is held to the inner wall of outer conductor 10 by the cross-arms 88*t*. Spring finger stock 21 extends inwardly towards the center of the disc to make contact with the inner conductor 12. The dielectric spacers (not shown) can be fed between the two conductors 10, 12 in the spaces between the two arms 88*t*. It should be understood that more than two arms 88*t* can be used to hold disc 88R in place. Also, several dielectric spacers can be fed into the structure between the arms 88*t*.

FIG. 14 shows another embodiment of the invention for forming the two-wire transmission line. Here, the tubular element 90 is preferably one of the composite materials previously mentioned and, if desired, its outer surface may be coated with a suitable metallic material. The material forming the element 90 is pre-stressed to curl, in the manner previously described, when released to form a tubular element. Alternatively, although not as strong as a composite material, a tape of plastic or other suitable dielectric material with a suitable amount of curl can be used.

A pair of metallic strips 92 are coated onto or otherwise affixed to a dielectric surface 91 which may either be the actual inner surface of element 90, or a separate layer affixed thereto. These metallic strips 92 can be of any suitable material, for example, copper, and they can be placed onto the dielectric by any suitable arrangement, for example as used in printed circuit techniques, by plating, by vacuum deposition, by adhesives, etc. Thus, as should be apparent, a self-supporting, two-wire transmission line comprising the two conductors 92 is formed when the element 90 curls into its final configuration. The spacing between the two elements 92 will be maintained substantially constant since the tubular element 90 is a fairly rigid structure.

While the embodiment shown in FIG. 14 places both of the conductors on the dielectric inner surface 91 of the element 90, it should be understood that the dielectric surface can also be either the other surface of the element or can be a separate layer affixed thereto and the two conductors placed thereon in which case the outer, conductive coating would not be applied. The advantage of the outer conductive coating is that it prevents the transmission line from radiating and ensures that substantially all of the propagated energy is delivered to or from the connector 98. However, the conductive coating is not essential except at relatively high frequencies. Further, should the dielectric thickness and necessary conductor width result in an inconvenient line impedance, an alternate shielding means, to be described subsequently in connection with FIG. 16, may be used.

In FIG. 14 a twin-lead transmission line 95 is shown as one of the couplings to the structure. A pair of spring fingers 96 at the end of line 95 makes contact with the metallic strips 92 forming the furlable transmission line. A coaxial type connector 98 is shown at the remote end of the extended element. One of the tapes 92 is connected to the outer conductor of the connector 98 while the other tape 92 is connected to the inner conductor of the coaxial connector. A balun may be interposed between the leads 92 and the connector 98 as required, for example, if 98 is further connected to an unbalanced element.

FIG. 15 shows an arrangement similar to that of FIG. 14 in which a different type of coupling is used. Here, the tubular extendible element 90 is provided with a shorting bar 100 at one end thereof which is spaced approximately one-quarter wavelength from the twin-lead transmission line 95. The shorting bar 100 has a number of spring fingers 101 which make electrical contact between the two metallic tapes 92 forming the transmission line to provide impedance matching and coupling in a well-known manner.

Figure 15A:
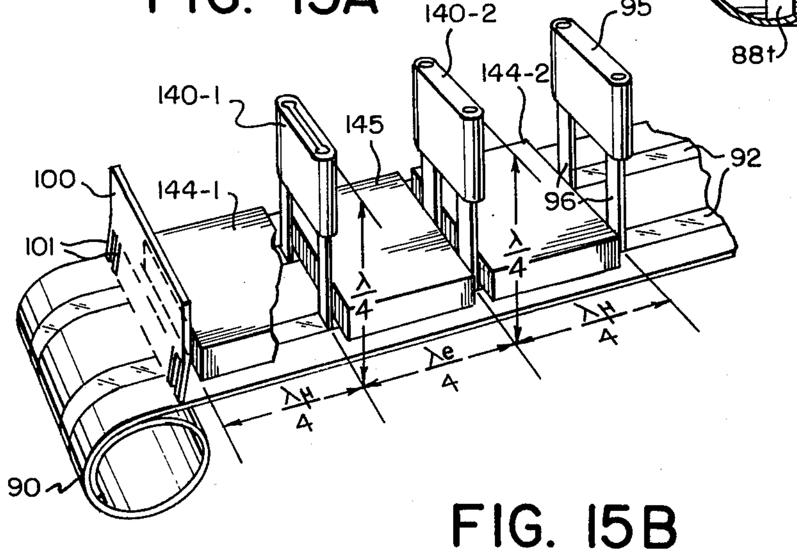
FIGS. 15A and 15B are views of broad band coupling arrangements for two-wire transmission line extendible structures.

FIG. 15A shows an arrangement for broadbanding the coupling to a twin-lead type transmission line tubular element 90. The arrangement generally follows FIG. 15. Two quarter-tuning stubs 140-1 and 140-2 and the signal coupling line 95 make sliding contact with the two conductive lines 92 of the element 90. Stub 140-1 is shorted at its end while 140-2 is open. The stubs can be of different impedances by suitably selecting the material for the stubs, e.g., wire size, wire spacing, etc. Between shorting bar 100 and stub 140-1 is a piece of low-loss magnetic material 144-1 and between stub 140-1 and stub 140-2 is a piece of low loss dielectric material 145. A second piece of low loss magnetic material 144-2 is located between stub 140-2 and the signal coupling line 95. The pieces of material 144-1 and 145 lie over the conductive lines 92 and are approximately one-quarter wavelength long at the nominal center frequency of operation where the wavelength is that obtaining in the magnetic and dielectric materials, $\lambda\mu$ and $\lambda\epsilon$ respectively. Piece 144-2, similarly positioned, is approximately one-quarter wavelength long at that frequency. These pieces can be any suitable material, for example, polystyrene for the dielectric material and foamed plastic with ferrite powder additive for the magnetic material. The separation between two adjacent blocks, where a stub 140 is connected, is negligible. The dielectric block is inherently insulating while the block of magnetic material is so fabricated or emplaced, atop an insulating sheet for example, that the lines 92 are not short-circuited. Further, the stubs 140 may be dielectrically insulated to prevent their leads from contacting and possibly being shorted by the block 144.

As many stubs and their corresponding pieces of dielectric or magnetic material can be cascaded as desired. The dielectric pieces lower the impedance of the section of the twin-lead transmission line with which they are in proximity. The pieces of magnetic material raise the impedance of the line sections with which they are in proximity. Additionally, the tuning stubs 140 can be selected to be of different impedances. As in the case of the various coupling systems of FIGS. 9A-9F, the end result is to present a broadband open circuit at the signal coupling point.

Figure 15B:
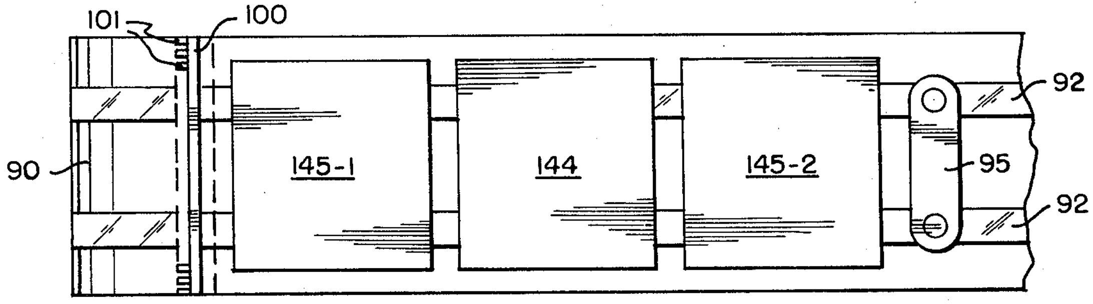

FIG. 15B shows another twin lead coupling arrangement. Here pieces of low loss dielectric material 144 and low loss magnetic material 145 are alternated. As in FIG. 15A, the pieces are in proximity with the strip leads 92. The pieces 144 and 145 are a quarter wavelength long at the nominal band center. The pieces may be allowed to touch other but need not be in contact. The effect of the arrangement is again to broadband the signal coupling any desired number of pieces being employed, and the only restriction being that shorting bar 100 be an odd number of quarter wavelengths from feed 95.

FIG. 16 shows another embodiment of the invention in which the twin-lead type tubular extendible element 90 of FIGS. 14 and 15 is located within another tubular extendible element 130 having at least a conductive inner surface to serve as a shield for the twin-lead formed by the element 90. The outer shielding element 130 can be of completely metallic material or else if desired of a composite material as previously described for additional strength. Furlable, extendible dielectric spacer elements such as those illustrated in FIGS. 12 and 13 may be introduced between the elements 90 and 130, to add strength and maintain the separation.

Figure 17A:
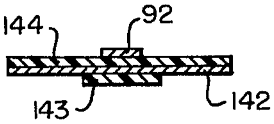
FIG. 17A is a cross-section of the structure of FIG. 17.

FIGS. 17 and 17A show another type of twin-lead arrangement in which only a single tubular extendible element is used. This element 140 either has a conductive outer surface 142 and a dielectric inner surface 144 made of one of the composite materials previously described or else is entirely of pre-stressed metal. An elongated tape type conductor 92 is placed or deposited thereon, separated from the metal, or the dielectric if necessary, by a dielectric tape of suitable thickness to establish the desired impedance. Thus, two transmission wires are provided, one the outer conductor 142 and the other the tape 92. Here, to provide the desired high impedance open circuit to a feed line, contact between the conductor tape 92 and the outer conductor 142 may be made by an open quarter-wave stub positioned between the undeployed transmission line and a feed line and a quarter wavelength from the feed. The stub then acts as the shorting contact for a modified quarterwave coupling similar to that of FIG. 15. In an alternate configuration, a band of dielectric material 143 may be affixed to or deposited on the outer conductor in order to insulate 92 from 142, as illustrated.

Figure 17B:
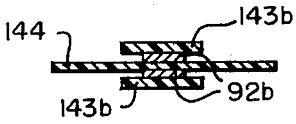
FIGS. 17B, 17C and 17C are further cross-sections of the type of structure of FIG. 17 showing different transmission line configurations.

FIG. 17B is a modification of the structure of FIG. 17 showing a balanced transmission line. Here, a furlable tape 144 of dielectric material is used. Electrically conductive strips 92*b* are placed in registry on each side of tape 144. Each conductive strip 92*b* is in turn covered by a band of dielectric material 143*b* for insulation when the structure is furled.

Figure 17C:
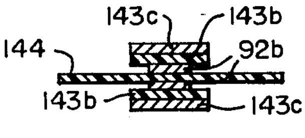

FIG. 17C shows an arrangement similar to that of FIG. 17B in which a shielded balanced transmission line is provided. The structure is the same except for the addition of a band of conductive material 143*c*, the shield, on top of each dielectric band 143*b*.

FIG. 17D shows a shielded unbalanced transmission line. This structure is similar to that of FIG. 17C with the exception that one of the strips 92*b* on one side of tape 144 has been removed.

Suitable modifications of the coupling techniques previously described can be used to couple energy to or from the line structures of FIGS. 17 and 17A-17D. Moreover, since each of these structures retains its characteristic impedance, even when rolled up, as at the spooled ends, simple sliding contacts contacting the strips 92 or 92*b* from within the rolled end will effect a simple, yet broadband and reliable coupling means.

It should be understood that where a coupling technique utilizes a quarter-wavelength element, any odd multiple of a quarter wavelength may be used as, for example, ¾ wavelengths, 5/4 wavelengths, etc. In fact the same flexibility of coupling element length applies to all the coupling means, whether for twin-lead or coaxial lines, described in this application, since the half-wavelength sections can be any convenient even multiple of ¼ wavelength. In any of the twin-lead structures, furlable dielectric elements may be used to fill the structure, adding strength and rigidity.

The twin-lead coupling embodiments shown in FIGS. 14 15, 15A and 15B can be used as the coupling arrangement for the embodiments of FIGS. 16, 17, and 17A-17D, with suitable modifications. Also, the antenna connecting arrangement shown in FIG. 14 can be utilized for any of the embodiments shown in FIGS. 15, 16, 17 or 17A-17D.

Thus far, there have been described transmission means using coaxial and twin-lead transmission lines, while in U.S. Pat. No. 3,541,568, there is described transmission means utilizing waveguides. A further transmission means that is well adapted to the tubular extendible structures described herein is surface-wave transmission.

Figure 26:
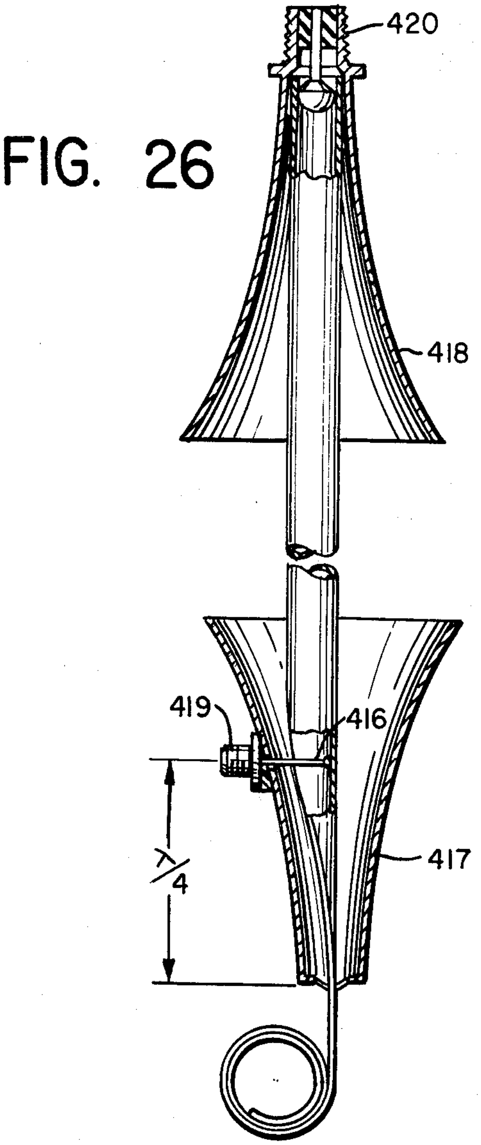
Figure 26B:
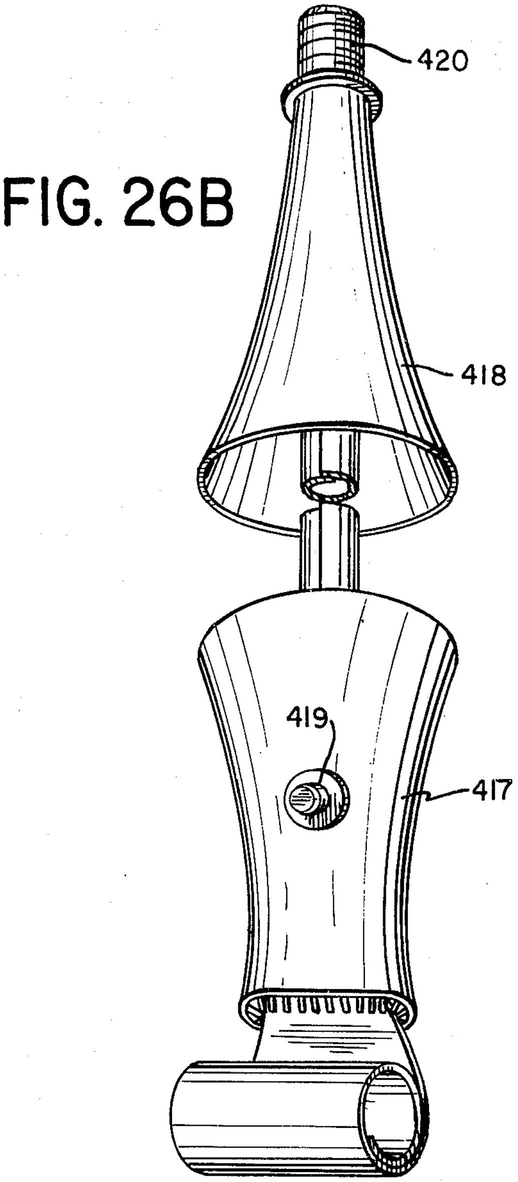

FIG. 26 illustrates one embodiment in which a tubular extendible element 10 is used to support a surface-wave transmission. Coupling section 417 is a conductive tube in the shape of a flared horn with one end closely conformal to the flattened tape just exiting from the spool, and flaring at the other end, to a launching horn. In this case, the extendible tape is conductive and has on its outside a dielectric film of appropriate properties and thickness, depending upon the frequency of the signal to be guided. Contact to the inner, conductive side of the tape is made by a sliding contact 416 which is connected to the central conductor of the terminal 419. The outer conductor of terminal 419 is connected to the launch tube 417.

The contact 416 is the feed point and it sees a high-impedance open circuit to its left which is effected by a short a quarter-wave length or any odd number of quarter-wave lengths away. The short at the desired point is preferably a metallic contact using finger stock mounted on or formed from the narrow end of the coupling section 417 which contacts the conductive inner surface of the tape.

At the remote, or extended, end of the structure a coupling section 418, which matches section 417, serves as a coupler to a coaxial connector 420. The inner conductor of connector 420 is connected to the inner conductive surface of the element 10 and the outer conductor is connected to the section 418. Since the extendible transmission line is circular at this point, the coupler 418 has no flattened portion, but is symmetrically circular, as shown.

Many of the broadbanding techniques heretofore described, for example those of FIGS. 9A through 9F may be used to achieve the desired system bandwidth and impedance. Furlable extendible members also may be introduced into the interior of the extendible line to strengthen and stiffen it.

Figure 26C:
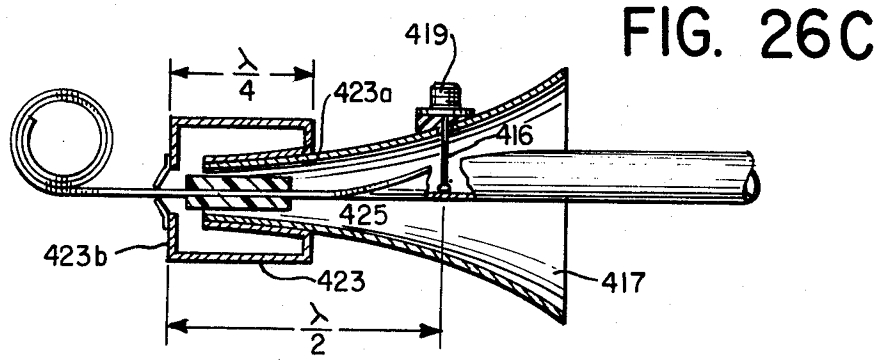
FIG. 26C is a cross-section of a further embodiment of coupler for the surface wave structure.

Another coupling arrangement is shown in FIG. 26C. Here the center conductor of connector 419 contacts the inner conductive surface of element 10 one-half wavelength from the short. In this case the coupling section 417 is fitted with a quarter-wavelength choke joint 423 having one end 423*a* connected to the section at a point between connector 419 and its left end. Dielectric spacers 425 keep the left end of coupling section 417 from shorting to the extendible element. The left end 423*b* of the choke joint contacts both the inner and the outer surfaces of the extendible element adjacent the left end of section 417. The choke joint is, in effect, a folded, half-wave line comprised of two quarter-wave sections, one of which is shorted at its end. It therefore results in an apparent short a quarter wavelength from the connector 419 and, therefore, an apparent open circuit at the connector for energy attempting to propagate toward the choke section. This arrangement makes the actual contact between the coupling section and the extendible element non-critical.

A similar arrangement may be used with the transition sections shown in FIG. 2, FIGS. 9A through 9F, and FIGS. 13A, 13C and 13D.

The extendible element in the embodiment of FIG. 26 need not be completely closed to effect propagation. Since there is no wave propagation within the conductive tube no precautions need be taken to keep out rainwater or other foreign matter. If desired, a few small holes can be drilled in the upward-facing coupling section 417 to permit accumulated rainwater to drain away. The extendible element 10 of FIG. 26 may be made of any of the materials and any of the configurations described previously.

FIGS. 18A through 18F show various types of wave transmission circuit elements which can be incorporated with any of the structures of the type shown in FIG. 14 through 17 and 17A-17D in which an elongated metallic tape is provided as a conductive lead on a dielectric surface of a tubular extendible element. In FIG. 18A there is shown a transition element 110, the narrow end of which would be attached to one of the tapes 92. Each of the steps of the transition element is approximately a quarter wavelength long.

FIG. 18B shows a phase shifter element 112 which also can be mounted in series with a conductor 92 onto the dielectric surface of an extendible element 90. The phase shifter is shown as a generally sinuous structure although any other suitable shape can be utilized.

FIG. 18C shows a series capacitor 114 formed in one of the tape transmission lines 92. Actually, all that this is, is a break in the tape conductor 92 at a given point where the capacitance is desired.

FIG. 18D shows a series inductor 116 formed in one of the tape lines 92. This is accomplished by merely narrowing down a section of the tape.

FIG. 18E shows a shunt capacitor between two tapes 92. The shunt capacitance is formed by making tabs 118 on each of the tapes 92 in an adjacent spaced relationship. The amount of capacitance can be controlled by the spacing between the two tabs 118 the widths of the tabs and their thickness.

FIG. 18F shows a shunt inductance which is formed between the two tapes 92 by bringing a piece of material 120 which is electrically connected between the two tapes 92 and is narrower than the tapes. Again, the value of the inductance can be adjusted by suitable selection of the length, width and thickness of 120.

As should be apparent from an explanation of FIGS. 18A through 18F any suitable electronic circuit element can be incorporated into the twin conductor structures of FIGS. 14–17, 17A-17D in one or both conductors and at any given place. Thus the twin-wire transmission line of the present invention is capable of use for a number of different applications.

As also should be apparent, since in the embodiments shown in FIGS. 14-17, 17A-17D, one of the surfaces of an extendible element is of dielectric material, other elements can be affixed to the dielectric surface. For example, integrated circuit elements can be affixed directly to the dielectric surface and the necessary voltages supplied to the integrated circuit by one or more power supplies which can also be connected to the integrated circuit by conductive leads or tapes on the dielectric surface. Since active circuit elements, integrated circuits for example, typically are formed by deposition, growth, sputtering, etc., of active material and conductors onto a dielectric substrate, such elements may be used even when the transmission lines themselves do not provide a convenient dielectric surface. Any desired elements may of course be mounted on a conductive surface merely by interposing segments of dielectric tape. The lines supplying power to the elements can be either open wire lines or else can be suitably insulated from and/or positioned with respect to the transmission line in a manner to minimize interaction between them. Alternatively, DC power can be supplied over the lines 92 and suitable RF decoupling circuits can be used. Similar means may be used to supply DC power to circuit elements positioned within the coaxial transmission lines described in this application, as for example inside the central conductor, or outside, as for example at or near the free end. Circuit elements may, of course, also be positioned external to the previously described twin-lead lines.

All such power-carrying lines can, of course, be augmented by more conventional means, for example, ordinary conductor wires at the transmission lines' free end. These can be used to connect the deployable, DC power-carrying lines to external circuit elements such as a separate power supply, an antenna-mounted preamplifier, etc.

In certain applications, the structures' ability to conduct DC, or for that matter AC, power may be the characteristic of greatest interest, superseding their usefulness as RF transmission lines. Here, their strength, storability and deployability would be the most attractive features, and they would be fitted at their free and fixed ends with connectors appropriate to the required power-carrying purposes.

In other applications the structures' mechanical features would be of interest. Thus they might be used to join two craft, to carry objects to places otherwise difficult of access, etc. Further, they may be fitted at their respective free ends with power tools that can be supplied with electricity through the power-carrying tape conductors previously described. If the structure is used to support and deploy a flexible pneumatic line, whether located along its center or externally borne, then it can be fitted at its free end with pneumatic tools.

In certain other applications it may be useful to interconnect such structures for the purpose of directly coupling together two or more equipments with transmissin lines. In such applications the deployed ends may be fitted with male and female couplings that may be screwed together, hermaphroditic couplings, etc. FIG. 21 illustrates a type of coupling that may be used to effect secure, latched coupling at a distance.

A mating, self-latching coupling 300 is shown in cross-section having upper and lower parts 300A and 300B. As the two lines are brought into alignment with the guide probe 301 on the lower part 300B they are pressed together, so that the bottom bevelled edge 302 of the upper lines' outer conductor 312A presses down spring-loaded dogs 304 that are mounted on the lower line connector 300B so that they snap into contact with the small latching ramps 305. Solid latching is accomplished as the coupling is driven home.

In the configuration shown in FIG. 21 the inner and outer conductors 312A and 310A upper line are slightly larger than the corresponding conductors 312B and 310B of the lower line. In addition, conductors 310A and 312A are bevelled on their inner surfaces and slotted peripherally to facilitate mating of the two lines to insure a snug fit. As many dogs and ramp sections as desired may be used.

To aid in the initial alignment when the free ends are remote from each other those ends may be fitted with sensing and homing systems. Electrical power for these systems can be carried by the power-carrying lines previously described. Signals from these systems can be carried to the fixed ends by the transmission-line conductors, for use in directing the positioning of the elements.

FIG. 19 shows an extendible element 90 with a dielectric composite inner surface 91. An integrated circuit package 150 is mounted on the dielectric surface. In one application, package 150 could be an LSI IC processor and repeater amplifier whose inputs and outputs are the tapes 92 conveying the signal to be processed and amplified. A power supply voltage tape 97 for the IC is also placed on the dielectric surface 91. The tape 97 only has to run as far as the last IC on the extendible element. If it is necessary to ground the IC or to provide a ground return conductor, a hole can be formed in element 90 to provide access to its conductive outer surface or a separate grounding tape can be provided.

Any or all of these elements may be incorporated in the transmission line structures or added externally, typically at the free end, to process, amplify, convert the frequency of, or otherwise modify the propagated signals and/or for the purpose of impedance matching or conversion. When employed they would be incorporated into the transmission line in such a manner as to minimize any resultant discontinuities, since such discontinuities would have the undesirable effect of causing the transmission line to radiate as an antenna.

The effects of solar illumination in a space environment, where there is no atmosphere to establish an ambient temperature, is to cause severe thermally-induced stressing between the illuminated and the unilluminated surfaces of space structures. When the structure is relatively thick, thermal conduction may be effective in equalizing the temperatures on the two surfaces. However, if the structure is thin, the thermal gradients are usually high and the resultant thermal stresses can result in significant bending.

In the case of deployable booms, such as those used as antennas and as the arms of gravity-gradient stabilization systems for satellites, their extreme thinness prevents thermal equalization by conduction and their great length results in severe bending. One very serious result as a gravity-gradient boom alternately bends and straightens, in accordance with the changing solar illumination, is that it pumps energy into the satellite to which it is attached, altering its orbit. The solutions to date have been to coat the outer surface of the boom with a highly reflective material, to reflect most of the incident solar energy; to perforate the outer surface so as to permit sunlight to leak into the boom's interior to warm the opposite side as well as the side facing the sun; to coat the inner surface with a thermally-absorbent coating to facilitate absorption and distribution by conduction of the incident solar energy; and to use booms formed of two or more elements with interlocking-tab edges to increase the boom's stiffness and resistance to bending.

All of the aforesaid techniques to prevent bending due to thermal stress are applicable to the extendible coaxial transmission line structures described above as well as to the extendible twin-line structures. Where perforation is used, the holes must be made small enough to act as waveguides operating beyond their cutoff frequency, to prevent radiation of appreciable radio frequency energy. Where the extendible element is formed of composite materials instead of metal, the holes must be throughplated to form, in effect, thin tubes, whose lengths are equal to the thickness of the element wall, with conductive inner walls.

Essentially all of the adverse mechanical effects of solar illumination can be overcome through the use of composite materials to form the extendible structure without resorting to the aforementioned mechanical solutions. The mechanical solutions can, if desired, be applied to structures formed of any material including those of composite material which are to be described below.

Composite materials, such as filaments of graphite and filaments of carbon in which each filament is formed of one or more individual fibers, and the filaments are embedded in a matrix of a suitable material, such as a plastic or epoxy resin, are known in the art. Sources for such composite material are Courtaulds Ltd. and Morganite Research and Development, Ltd., both of England and Union Carbide Corp. and Whittaker Corp., both of the United States. These materials have far smaller coefficients of thermal expansion than the metals in common use in extendible structures. This limits the severity of thermal effects. The properties of composite materials can, in general, be tailored to accommodate a wise range of potential uses. Specifically, the coefficients of thermal expansion can be adjusted through the choice of the filaments, the precise method of their manufacture and the choice of the matrix in which they are embedded. Carbon filaments used in the manufacture of carbon composites have excellent characteristics in this respect. Not only are their coefficients of linear thermal expansion a minute fraction of those of metals, but they are available with either positive or negative coefficients of thermal expansion.

FIG. 20A shows a portion of a composite, prestressed tape which forms an extendible structure. A plurality of carbon filaments 202 in a matrix 203 of suitable resin material comprise the tape. The filaments can be single elongated fibers laid side by side or each filament can be formed of one or more fibers. While an organized pattern of parallel filaments are shown, pieces of filaments can be used which are laid down generally parallel to the elongated axis of the tape. The filaments are bonded in a matrix 203 and form the tape which is constructed to unfurl as is described below.

In those cases where the desired properties cannot be achieved with a single type of filament, two or more types of filaments can be used. FIG. 20B shows alternate strands of negative temperature coefficient filaments 205 and positive temperature coefficient filaments 206, laid side-by-side to form a composite with an overall temperature coefficient that is essentially zero. In composite systems of the type of FIG. 20B, the bonding matrix is subject to severe stresses and one must be used that is both sufficiently flexible, to prevent cracking, and sufficiently strong. More than two different types of filaments with different temperature coefficients can be used.

FIG. 20C shows an arrangement wherein the different filaments are layed cross-wise to each other in alternate layers. This controls the expansion of the tape in two directions and further rigidifies the structure.

FIG. 20D shows another composite structure. Here, filaments 202 are shown which are held in a matrix of conductive material 230. One suitable material is an epoxy plastic in which is embedded silver particles. Such a material is made by the Emerson & Cumings Company. This arrangement provides a thermally stable extendible element which also is conductive due to the material of the matrix. Any of the other composite structures of FIGS. 20A, 20B and 20C can be embedded in such a matrix of conductive material.

Since, in general, these structures need only be conductive on either or both of their surfaces any of the many well known techniques for metallically coating plastic materials may be used to achieve this surface conductivity, a thickness appropriate to the "rf skin depth" of the frequency or frequencies of operation being created in each case. Conductivity can also be achieved through the application of adhering metallic tapes.

It is also possible to use metal fibers such as metal crystals or metal "whiskers" as the fibers of a composite material (boron composites are one example of this) as well as for the matrix (boron fibers in an aluminum matrix is an example of this). Fiberglass in a resin matrix is a more familiar type of composite. The transmission-line structures described in this application can readily be fabricated with these types of composites as well as with the types shown in FIGS. 20A, 20B, 20C and 20D.

Similar fabrication techniques can be applied to a wide variety of structures. Booms or other extendible members formed of composites have another great advantage over the more conventional metal tape members. They are far stiffer and thermally stabler and therefore far less subject to flexing and swaying when the object to which they are attached is moved or when they are exposed to solar illumination. Such flexing has been a serious limitation of gravity-gradient booms made of metal. Other structures include panels and supporting structures used for mounting solar-energy cells, instrument-mounting booms, long structural elements, etc. The technique can even be applied to the spacecraft structure itself, or, for that matter, to space shelters, such as might be erected on the moon, etc. It is important to recognize that it is the outer layers of structure that are most significant in determining its sensitivity to differential solar illumination. The interior layers may be made of tapes differently formed and laid at different angles to achieve the desired strength in any direction, yet without compromising the inherent stability under thermally-induced stress.

While not specifically shown herein, many of the techniques of my U.S. Pat. No. 3,541,568 for sealing the elements and preventing and/or reducing moisture, hermetic sealing, automatic righting, automatic erection, etc., can be used with the extendible structures of the subject application.

It should be noted that the side-by-side laying up of fibers with different coefficients of thermal expansion, represents an exact method of mixing together the types of fibers. Similar results can be achieved by selecting the fibers at random from a large well-mixed sample, although, with this method, there is a small, but potentially significant likelihood that one or another type of fiber will predominate in the resultant selection.

One method of insuring that the desired properties are realized is to actually mix together, in the necessary ratio, short lengths of fibers that possess the appropriate thermal coefficients. The resultant mixture may then be blended with the desired bonding matrix material and either cast or molded to form relatively thick objects, or spread or rolled out to form slabs or thin sheets. These may then be cured in any appropriate manner. Alternatively, the matrix material may be added before mixing, the whole then being mixed, formed and cured. While the use of short fibers will tend to result in objects whose temperature coefficients of volumetric expansion are precisely controlled, (this is true, at least, in the case of relatively thick objects made by these means), it is possible to achieve essentially the same characteristics in any one desired dimension by further working the objects before they are cured. For example, if it is desired that a slab so formed have the precisely controlled thermal coefficient of expansion in one direction alone, then, after it is roughly shaped, the slab may be stretched in that direction by an amount that is at least equal to the length of the longest fibers it contains, causing all the fibers to align in that direction. The slab can then be cured and, finally, trimmed to the precise dimensions desired.

Of course, if the fibers are short compared to the final objects' length in the direction (or directions) of interest, then the thermal coefficients, strength, etc., of the matrix itself will be a major factor in the objects' characteristics. Ideally, the individual fibers should lie as long as the final object and extend in the direction of interest.

Thus, for example, a rectilinear three-dimensional mesh of fibers is the ideal configuration for controlling precisely the volumetric properties of a relatively bulky object. However, a close approximation to any desired property can be achieved by laying up a three-dimensional mesh of suitable strips of fibers that have been pre-impregnated with the desired matrix material, so that they may be handled as a single element, and then compacting and curing the resultant object.

Objects made by any of the above means will be exceptionally strong and stiff, for their weight, and will possess far greater thermal stability than objects made of such materials as Invar. Rods and blocks made by such means and suitably lapped and polished could be used as gauge rods and guage blocks. These could, of course, be fitted with thin, wear-resistant metal plates at their working surfaces. Other uses for objects made by these means include applications in precision optics, for example, mounts, holders, mirrors (when coated with suitable reflecting surfaces, etc. Further applications would be as cavities, stubs and probes for precision radio-frequency meters, for radio-frequency filters, etc. In fact, they will be useful in any application where stability of dimension is critical. In all such applications they will provide a strong, lightweight and economical solution to what have been difficult problems.

In the case of tubular elements, well known manufacturing techniques can be adapted to produce elements that exhibit excellent axial dimensional stability under thermal excitation. Continuous lengths of such elements can be formed by braiding about a mandrel either a single type of fiber or a suitable mixture of fibers with appropriate thermal coefficients, in a manner similar to that now used to add layers of radio-frequency shielding and/or armoring onto electrical cables. FIG. 22 illustrates the method. A plurality of spools 330 containing the desired fibers, braids or tows in continuous lengths are automatically moved by conventional winding or braiding machinery to produce a braided mesh 332 on a mandrel 331. Next, the mesh is impregnated with the desired matrix as shown by the block 334, and finally, the composite is cured as shown by block 335, and drawn off the end of the mandrel. Simply slitting the cured element along its length as it leaves the mandrel will now suffice to permit its being flattened out and rolled onto a spool for subsequent use as a deployable element. The curl provided by the mandrel gives the piece the ability to unfurl in a longitudinal direction. The unfurled element will also tend to go back to its curved, circular, shape.

In those cases where overlap is desired in the deployed element, simple slitting will not suffice. A number of methods will readily yield the desired configuration. For example, as shown in FIG. 23, the slit tube 332 can be wrapped with release paper 340, or coated with a release agent, rolled tightly upon itself and passed through a forming tube wherein it can be heated to a temperature just sufficient to soften the matrix.

The matrix can now be rehardened and the tube will retain its rolled-up shape. The release paper or release agent will prevent adhesion between the several layers of the rolled-up tube, as well as between the matrix and the forming tube. A similar technique can be used to make tubes with less than a complete, two-layer overlap.

Another method would be to form the braided mesh 332 and impregnate it, as before, but wrap it onto a smaller mandrel for curing, as shown in cross-section in FIGS. 24 and 25. Here too, release papers 340 or agents would be used to prevent undesired adhesion. The structure of FIG. 24 would be cut through at P and Q as shown and the S-shaped section between P and Q would be discarded. In the case of the structure shown in FIG. 25, the adjacent layers of the structure can be permitted to fuse in curing, to form a wall of double thickness, while at the same time, adjacent wraps are prevented from adhering through the use of release agents or release papers. Alternatively, release agents or release papers can be interposed between adjacent layers as well between adjacent wraps, and the ends cut off at P′ and Q′. The result will be a pair of interwrapped structures which may then be separated for individual use as tubular extendible elements. Any even number of tubular extendible elements may be made in this manner, by suitably folding and wrapping around a mandrel for curing, a braided tubular mesh, made as previously described, and with adjacent sections separated as desired by release papers and/or release agents.

In my prior U.S. Pat. No. 3,541,568, an arrangement in the form of an adhesive tape is disclosed for sealing the overlapping edges of the tape forming the extendible element. This arrangement can also be utilized in the subject invention wherein one or more extendible elements are utilized. It is also possible to seal the overlapping edges of the tape or tapes together by the use of a so-called "instant adhesive". Such adhesives are generally of the type containing an alpha-cyanoacrylate compound. One such adhesive is manufactured by the Pearl Chemical Company of Tokyo, Japan. The adhesive is distributed under various tradenames in this country, one such being PERMA-BOND.

What is claimed is:

1. A collapsible and extendible coaxial transmission line comprising first and second tubular self-extendible elements of different cross-sectional areas, each of said elements comprising a separate web of prestressed material of the type which curls when unrolled from a roll in a relatively flat shape into a tubular configuration, each of said first and second tubular extendible elements including means for propagating radio frequency energy, the curled tubular portion of one extendible element being of a smaller cross-sectional size than the curled tubular portion of the other extendible element, means locating said tubular portion of said one extendible element being within the tubular portion of the other extendible element and spaced therefrom along its length to define a coaxial transmission line, and means for coupling radio frequency energy to the energy propagating portions of said first and second extendible elements.

2. A transmission line as in claim 1 wherein said means for propagating the radio frequency energy comprises electrically conductive portions on each of said webs of said first and second elements, and means for coupling radio frequency energy to said electrically conductive portions of said two elements at a point where both said elements have a tubular shape.

3. A transmission line as in claim 2 wherein said energy coupling means comprises a transition means having spaced conductive means electrically contacting the respective, electrically conductive portions of both said first and second elements, a connector, said connector having one conductor electrically connected to the conductive portion of one of said elements at a point between the places where the spaced conductive means of the transition means make electrical contact with said elements.

4. A transmission line as in claim 3 wherein at least one of said spaced conductive means of said transition means is movable longitudinally of the line.

5. A two wire radio frequency energy transmission line comprising first and second tubular self-extendible elements of different cross-sectional areas each formed of a separate web of prestressed material of the type which curls when unrolled from a roll into the tubular shape, each of said first and second tubular extendible elements having a portion of electrically conductive material, the electrical conductive portions of said extendible elements being capable of propagating the radio frequency energy, and means locating said second tubular element within said first tubular element and spaced therefrom along its length.

6. A transmission line as in claim 5 further comprising means for coupling radio frequency energy to said electrically conductive portions of said two elements, said energy coupling means comprising a connector having a portion in electrical contact with the conductive portion of said first element, said connector also having a conductor making electrical contact with the conductive portion of said second element.

7. A transmission line as in claim 6 further comprising shorting means electrically contacting the conductive portions of both said first and second elements at a point spaced from said conductor of said connector.

8. A transmission line as in claim 7 wherein said conductor of said connector and said shorting means are movable with respect to the conductive portions of said first and second elements.

9. A transmission line as in claim 5 further comprising means for coupling radio frequency energy to said electrically conductive portions of said two elements, said energy coupling means comprising an input transmission line, and a first transition section electrically connected between a conductor of the input transmission line and the conductive portion of one of the tubular elements.

10. A transmission line as in claim 9 wherein said input transmission line is a two conductor line and said radio frequency coupling means further comprises a second transition section electrically connected between the other conductor of the input transmission line and the conductive portion of the other of the tubular elements.

11. A transmission line as in claim 9 wherein said two transition sections are separated from each other by a piece of insulating material.

12. A two wire transmission line as in claim 5 further comprising means for coupling radio frequency energy to said electrically conductive portions of said two elements, said energy coupling means comprising a first electrically conductive shielding member enclosing the rolled end of one of the tubular extendible elements, means on said first shielding member making electrical contact with the electrically conductive portion of said one tubular element, and means electrically connecting the first shielding member to an energy supply source.

13. A two wire transmission line as in claim 12 wherein said energy coupling means includes a second electrically conductive shielding member enclosing the rolled end of the other of said tubular elements, means on said second shielding member making electrical contact with the electrically conductive portion of said other tubular element, and means electrically connecting the second shielding member to an energy supply source.

14. A two wire transmission line as in claim 13 further comprising insulating means separating said first and second shielding members.

15. A two wire transmission line as in claim 14 wherein said shielding members have curved outer surfaces, said insulating means having a curved portion which conforms to the outer shape of both of said housings.

16. A two wire transmission line as in claim 5 wherein the tubular portions of said extendible elements each forms a respective closed cylinder.

17. A two wire transmission line as in claim 5 wherein the tubular portion of one of said two tubular extendible elements forms a generally cylindrical structure with a longitudinal opening along the length of the cylinder.

18. A two wire transmission line as in claim 5 wherein the web of material of at least one of said tubular extendible elements comprises at least two furlable sections which are interleaved and assume the form of a spiral.

19. A two wire transmission line as in claim 5 wherein the tubular portion of one of said tubular extendible elements has its edges overlapping.

20. A two wire transmission line as in claim 5 wherein said spacer means between the tubular portions of the first and second elements are of electrical insulating material and maintains concentric spacing of the tubular portions of the two elements.

21. A two wire transmission line as in claim 20 wherein said spacer means comprises at least one elongated strip of electrical insulating material which curls about its own longitudinal axis when free, said strip lying on a surface of one of the webs of material of the two elements when said one web is rolled and in a position to curl when the said web of said one element curls into the extendible element.

22. A two wire transmission line as in claim 21 wherein said strip of insulating material curls into a generally cylindrical shape.

23. A two wire transmission line as in claim 21 wherein said strip of electrical insulating material curls into a generally curved shape having a generally arcuate cross-section with both edges of the strip engaging the same surface of the tubular portion of the same element.

24. A two wire transmission line as in claim 21 wherein there are a plurality of said strips including at least one set of strips whose pieces lie one on top of the other while rolled.

25. A two wire transmission line as in claim 24 wherein there are a plurality of said sets of strips lying in generally parallel relationship.

26. A two wire transmission line as in claim 20 further comprising spacer feed means located between said first and second elements in the area whee one of said elements goes from the rolled to the curled state, said spacer feed means having at least one slot formed therein through which said strip of insulated spacer material can pass.

27. A two wire transmission line as in claim 26 wherein said spacer feed means includes conductive material, a transition section, said spacer feed means electrically connecting said transition section and one of said first and second elements.

28. A transmission line as in claim 5 further comprising means for coupling radio frequency energy to said electrically conductive portions of said two elements, said means for coupling energy comprising transition means electrically connected between said first and second elements, said transition means including transformer means for broadening the bandwidth of the energy coupling.

29. A transmission line as in claim 28 wherein said transformer means comprises a plurality of cavity means of respectively high and low impedance which are cascaded together and through which said second elements extend, said plurality of cavity means establishing a point of high impedance on said second element, and means coupling the energy to said second element at said high impedance point.

30. A transmission line as in claim 29 wherein each of said cavity means is substantially one-quarter wavelength long at the frequency of the energy supplied to the transmission line.

31. A transmission line as in claim 29 wherein there are a plurality of said high impedance and said low impedance cavity means cascaded together.

32. A transmission line as in claim 31 wherein said plurality of cavity means all have the same outer diameter.

33. A transmission line as in claim 29 wherein said cavity means all have the same outer diameter.

34. A transmission line as in claim 28 wherein said transformer means comprises at least one tuning stub means.

35. A transmission line as in claim 34 wherein there are a plurality of tuning stub means, at least two of which have different impedances.

36. A transmission line as in claim 28 wherein said transformer means comprises at least one strip line means.

37. A transmission line as in claim 36 wherein there are a plurality of said strip line means at least two of which have different impedances.

38. A transmission line as in claim 28 wherein said transformer means comprises an inter-cavity folded filter.

39. The structure of claim 5 further comprising a second transmission line of the same construction, and means for mechanically connecting the two transmission lines together with the first element of one line electrically connected to the first element of the second line and the second element of one line electrically connected to the second element of the other line.

40. The structure of claim 39 wherein said means mechanically connecting the two lines together comprises cooperating mechanical latching means on each of said lines.

41. The structure as in claim 40 wherein said latching means includes spring loaded latching fingers on one line and latching lugs on the other line.

42. A transmission line as in claim 5 further comprising means for coupling radio frequency energy to said first and second extendible elements located in the area where the webs of materials of said extendible elements go from a rolled to a curled condition.

* * * * *